United States Patent
Takahashi

(10) Patent No.: US 11,217,579 B2
(45) Date of Patent: Jan. 4, 2022

(54) SEMICONDUCTOR APPARATUS

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 95 days.

(21) Appl. No.: 16/589,987

(22) Filed: Oct. 1, 2019

(65) Prior Publication Data

US 2020/0168601 A1    May 28, 2020

(30) Foreign Application Priority Data

Nov. 26, 2018    (JP) ............................. JP2018-220111

(51) Int. Cl.
| | | |
|---|---|---|
| H01L 27/06 | (2006.01) | |
| H01L 29/06 | (2006.01) | |
| H01L 29/10 | (2006.01) | |
| H01L 29/40 | (2006.01) | |
| H01L 29/66 | (2006.01) | |
| H01L 21/265 | (2006.01) | |

(Continued)

(52) U.S. Cl.
CPC ........ *H01L 27/0664* (2013.01); *H01L 21/266* (2013.01); *H01L 21/26513* (2013.01); *H01L 21/324* (2013.01); *H01L 29/0623* (2013.01); *H01L 29/1095* (2013.01); *H01L 29/404* (2013.01); *H01L 29/66348* (2013.01); *H01L 29/7397* (2013.01)

(58) Field of Classification Search
CPC ............. H01L 27/0664; H01L 29/0619; H01L 29/0623; H01L 29/0638; H01L 29/0834; H01L 29/0696; H01L 29/1095; H01L 29/404; H01L 29/66348; H01L 29/7396; H01L 29/7397

See application file for complete search history.

(56) References Cited

U.S. PATENT DOCUMENTS 5,289,019 A    2/1994   Terashima
5,372,954 A    12/1994   Terashima
(Continued)

FOREIGN PATENT DOCUMENTS

JP           2689047 B2    12/1997
JP      2002-299623 A    10/2002
(Continued)

OTHER PUBLICATIONS

An Office Action mailed by the Japan Patent Office dated Nov. 9, 2021, which corresponds to Japanese Patent Application No. 2018-220111 and is related to U.S. Appl. No. 16/589,987; with English translation.

*Primary Examiner* — Allan R Wilson

(74) *Attorney, Agent, or Firm* — Studebaker & Brackett PC

(57) ABSTRACT

A semiconductor apparatus includes a semiconductor substrate and a second electrode. Semiconductor substrate includes a device region and a peripheral region. An n⁻ drift region and second electrode extend from device region to peripheral region. An n buffer layer and a p collector layer are provided also in peripheral region.
Peripheral region is provided with an n type region. N type region is in contact with second electrode and n buffer layer. The turn-off loss of the semiconductor apparatus is reduced.

8 Claims, 19 Drawing Sheets

(51) Int. Cl.
*H01L 21/266* (2006.01)
*H01L 21/324* (2006.01)
*H01L 29/739* (2006.01)

(56) References Cited

U.S. PATENT DOCUMENTS

| | | | |
|---|---|---|---|
| 8,648,385 B2 * | 2/2014 | Kouno | H01L 29/0619 |
| | | | 257/140 |
| 2004/0119087 A1 | 6/2004 | Veeramma et al. | |
| 2009/0242931 A1 * | 10/2009 | Tsuzuki | H01L 29/167 |
| | | | 257/143 |
| 2014/0209971 A1 | 7/2014 | Zhu et al. | |
| 2015/0144995 A1 | 5/2015 | Takahashi | |
| 2015/0171199 A1 | 6/2015 | Senoo | |
| 2016/0093725 A1 | 3/2016 | Takahashi | |
| 2016/0329322 A1 | 11/2016 | Takahashi | |
| 2016/0351657 A1 | 12/2016 | Senoo | |
| 2019/0319026 A1 * | 10/2019 | Yoshida | H01L 27/0664 |

FOREIGN PATENT DOCUMENTS

| | | | |
|---|---|---|---|
| JP | 2015-118989 A | 6/2015 | |
| JP | 5967065 B2 | 8/2016 | |
| JP | 2016225363 A | 12/2016 | |
| JP | 6119577 B2 | 4/2017 | |

* cited by examiner

SEMICONDUCTOR APPARATUS

BACKGROUND OF THE INVENTION

Field of the Invention

The present invention relates to a semiconductor apparatus.

Description of the Background Art

Japanese Patent Laying-Open No. 2016-225363 discloses a semiconductor apparatus including a device region and a peripheral region surrounding the device region. A semiconductor device such as an insulated gate bipolar transistor (IGBT) is formed in the device region. A guard ring is formed in the peripheral region in order to ensure the breakdown voltage of the semiconductor device.

SUMMARY OF THE INVENTION

In the semiconductor apparatus disclosed in Japanese Patent Laying-Open No. 2016-225363, a current flows from an emitter electrode to a collector electrode in an ON state of the semiconductor device. Some of this current also flows into the peripheral region. Electrons and holes are accumulated in the peripheral region. The amount of holes to be discharged from the peripheral region during a turn-off process of the semiconductor device (process of transition from an ON state to an OFF state of the semiconductor device) increases. Thus, the semiconductor apparatus disclosed in Japanese Patent Laying-Open No. 2016-225363 has a high turn-off loss. The present invention has been made in view of the problem described above, and an object of the present invention is to reduce the turn-off loss of a semiconductor apparatus.

A semiconductor apparatus in a first aspect of the present invention includes a semiconductor substrate having a front surface and a back surface, a first electrode provided on the front surface, and a second electrode provided on the back surface. The semiconductor substrate includes a device region including a first semiconductor device, and a peripheral region surrounding the device region. The first semiconductor device includes an $n^-$ drift region, a p base region, an $n^+$ emitter region, a gate insulating film, a gate electrode, an n buffer layer, and a p collector layer. The $n^+$ emitter region is in contact with the first electrode. The gate insulating film is provided on a portion of the p base region between the $n^+$ emitter region and the $n^-$ drift region. The gate electrode faces the portion of the p base region with the gate insulating film interposed therebetween. The n buffer layer is in contact with the $n^-$ drift region, and is provided on the back surface side with respect to the n drift region. The p collector layer is in contact with the n buffer layer and the second electrode, and is provided on the back surface side with respect to the n buffer layer. The $n^-$ drift region, the n buffer layer and the second electrode extend from the device region to the peripheral region. The p collector layer is provided also in the peripheral region. The peripheral region is provided with an n type region. The n type region is in contact with the second electrode and the n buffer layer. A first area ratio of the n type region in an inner portion of the peripheral region to the n type region in the peripheral region is greater than a second area ratio of the n type region in an outer portion of the peripheral region to the n type region in the peripheral region.

A semiconductor apparatus in a second aspect of the present invention includes a semiconductor substrate having a front surface and a back surface, a first electrode provided on the front surface, and a second electrode provided on the back surface. The semiconductor substrate includes a device region including a first semiconductor device, and a peripheral region surrounding the device region. The first semiconductor device includes an $n^-$ drift region, a p base region, an $n^+$ emitter region, a gate insulating film, a gate electrode, an n buffer layer, and a p collector layer. The $n^+$ emitter region is in contact with the first electrode. The gate insulating film is provided on a portion of the p base region between the $n^+$ emitter region and the $n^-$ drift region. The gate electrode faces the portion of the p base region with the gate insulating film interposed therebetween. The n buffer layer is in contact with the $n^-$ drift region, and is provided on the back surface side with respect to the $n^-$ drift region. The p collector layer is in contact with the n buffer layer, and is provided on the back surface side with respect to the n buffer layer. The $n^-$ drift region, the n buffer layer, the p collector layer and the second electrode extend from the device region to the peripheral region. The peripheral region is provided with an n type region. The n type region is in contact with the second electrode. The p collector layer includes a p collector portion between the n buffer layer and the n type region.

A semiconductor apparatus in a third aspect of the present invention includes a semiconductor substrate having a front surface and a back surface, a first electrode provided on the front surface, and a second electrode provided on the back surface. The semiconductor substrate includes a device region including a first semiconductor device, and a peripheral region surrounding the device region. The first semiconductor device includes an $n^-$ drift region, a p base region, an $n^-$ emitter region, a gate insulating film, a gate electrode, and a p collector layer. The $n^+$ emitter region is in contact with the first electrode. The gate insulating film is provided on a portion of the p base region between the $n^-$ emitter region and the $n^-$ drift region. The gate electrode faces the portion of the p base region with the gate insulating film interposed therebetween. The p collector layer is provided on the back surface side with respect to the $n^-$ drift region, and is in contact with the second electrode. The $n^-$ drift region and the second electrode extend from the device region to the peripheral region. The peripheral region is provided with an insulating region, the insulating region being between the $n^-$ drift region and the second electrode, and being in contact with the second electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic partially-enlarged sectional view showing a step of a method of manufacturing a semiconductor apparatus according to a fourth embodiment. FIG. 4 is a schematic partially-enlarged sectional view showing a step of a method of manufacturing a semiconductor apparatus according to a sixth embodiment.

FIG. 5 is a schematic partially-enlarged sectional view showing a step subsequent to the step shown in FIG. 4 in the method of manufacturing the semiconductor apparatus according to the fourth embodiment. FIG. 5 is a schematic partially-enlarged sectional view showing a step subsequent to the step shown in FIG. 4 in the method of manufacturing the semiconductor apparatus according to the sixth embodiment.

FIG. 6 is a schematic partially-enlarged sectional view showing a step subsequent to the step shown in FIG. 5 in the method of manufacturing the semiconductor apparatus according to the fourth embodiment. FIG. 6 is a schematic partially-enlarged sectional view showing a step subsequent to the step shown in FIG. 5 in the method of manufacturing the semiconductor apparatus according to the sixth embodiment.

FIG. 19 is a schematic partially-enlarged sectional view showing a step subsequent to the step shown in FIG. 6 in the sixth embodiment.

FIG. 20 is a schematic partially-enlarged sectional view showing a step subsequent to the step shown in FIG. 19 in the sixth embodiment.

FIG. 21 is a schematic partially-enlarged sectional view showing a step subsequent to the step shown in FIG. 20 in the sixth embodiment.

FIG. 22 is a schematic partially-enlarged sectional view showing a step subsequent to the step shown in FIG. 21 in the sixth embodiment.

DESCRIPTION OF THE PREFERRED EMBODIMENTS

Embodiments of the present invention are described below. It should be noted that the same components are designated by the same reference numbers and will not be described repeatedly.

First Embodiment

Figure 1:
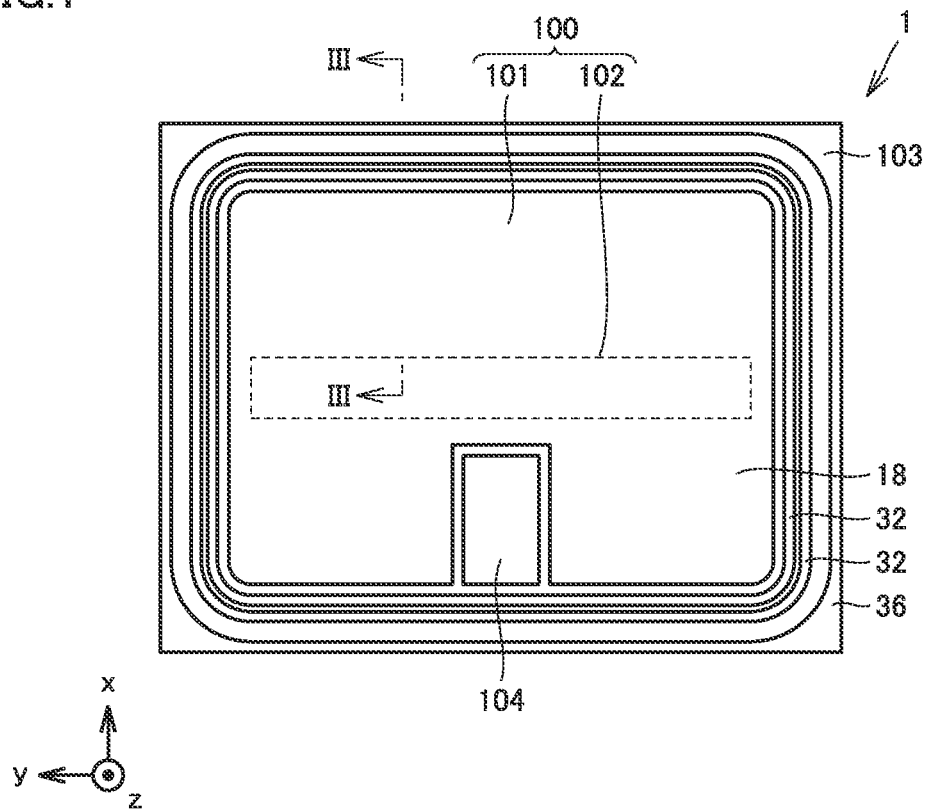
FIG. 1 is a schematic plan view of a semiconductor apparatus according to a first embodiment.
Figure 2:
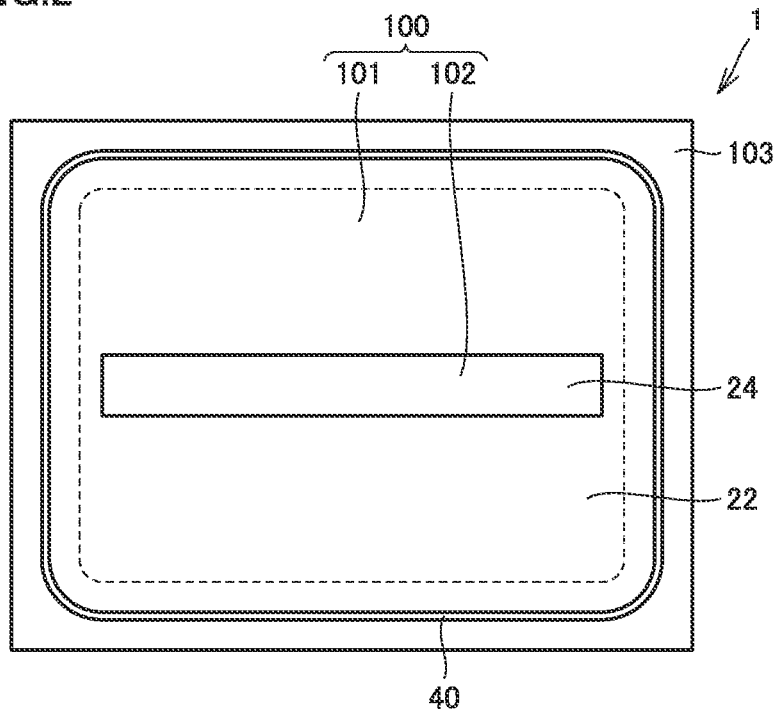
FIG. 2 is a schematic bottom view of the semiconductor apparatus according to the first embodiment.
Figure 3:
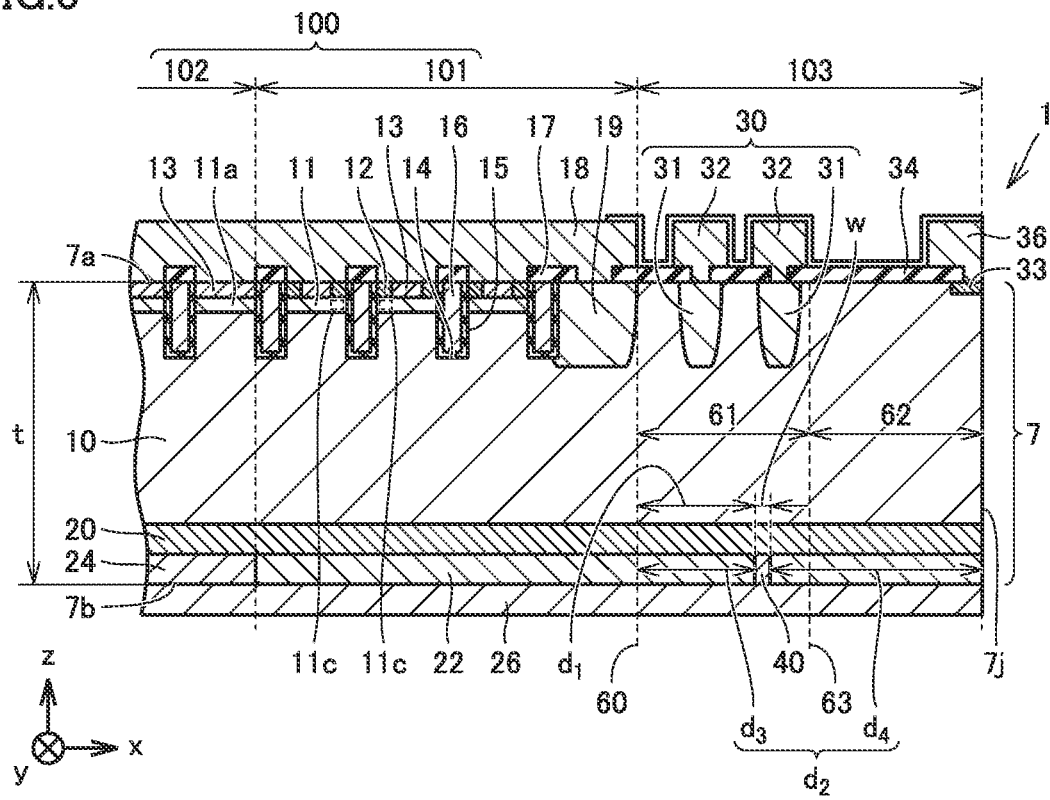
FIG. 3 is a schematic partially-enlarged sectional view of the semiconductor apparatus according to the first embodiment, which is taken along a section line III-III shown in FIG. 1.

Referring to FIGS. 1 to 3, a semiconductor apparatus 1 according to a first embodiment is described. Semiconductor apparatus 1 mainly includes a semiconductor substrate 7, a first electrode 18, and a second electrode 26. Semiconductor apparatus 1 may further include a gate pad 104, a floating electrode 32, and a channel stop electrode 36.

Semiconductor substrate 7 is a silicon substrate or a silicon carbide substrate, for example. Semiconductor substrate 7 has a front surface 7a, and a back surface 7b opposite to front surface 7a. Semiconductor substrate 7 includes a device region 100, and a peripheral region 103 surrounding device region 100. Device region 100 includes a first semiconductor device region 101. A first semiconductor device is formed in first semiconductor device region 101. The first semiconductor device is an insulated gate bipolar transistor (IGBT), for example. Device region 100 may further include a p well region 19. As shown in FIG. 3, first electrode 18 is provided on front surface 7a. Second electrode 26 is provided on back surface 7b.

As shown in FIG. 3, the first semiconductor device includes an n⁻ drift region 10, a p base region 11, an n⁺ emitter region 12, a p⁺ contact layer 13, a gate insulating film 15, a gate electrode 16, an n buffer layer 20, and a p collector layer 22.

P base region 11 is in contact with n⁻ drift region 10, and is provided on the front surface 7a side with respect to n⁻ drift region 10. N⁺ emitter region 12 is formed at a portion of front surface 7a. N⁺ emitter region 12 is in contact with first electrode 18. N⁺ emitter region 12 is in contact with p base region 11. N⁺ emitter region 12 is separated from n⁻ drift region 10 by p base region 11. P⁺ contact layer 13 is formed at a portion of front surface 7a where n⁺ emitter region 12 is not formed. P⁺ contact layer 13 is in contact with p base region 11. A hole (p type carrier) concentration in p⁺ contact layer 13 is higher than a hole concentration in p base region 11.

Gate insulating film 15 is provided on a portion 11c of p base region 11 between n⁺ emitter region 12 and n⁻ drift region 10. A channel is formed at portion 11c of p base region 11 during ON operation of the first semiconductor device. Specifically, semiconductor substrate 7 is provided with a trench 14 that extends through n⁺ emitter region 12 and p base region 11 to reach n⁻ drift region 10. Gate insulating film 15 is formed on a side wall and a bottom surface of trench 14. Gate insulating film 15 is a SiO₂ film, for example.

Gate electrode 16 faces portion 11c of p base region 11 with gate insulating film 15 interposed therebetween. As one example, gate electrode 16 is a trench gate electrode, and the first semiconductor device is a trench gate IGBT. Gate electrode 16 is provided on gate insulating film 15 within trench 14.

N buffer layer 20 is in contact with n⁻ drift region 10, and is provided on the back surface 7b side with respect to n⁻ drift region 10. An electron (n type carrier) concentration in n buffer layer 20 is higher than an electron concentration in n⁻ drift region 10. N buffer layer 20 has an electron concentration of not less than $1.0 \times 10^{15}$ cm⁻³, for example. N buffer layer 20 may have an electron concentration of not less than $5.0 \times 10^{16}$ cm⁻³. N buffer layer 20 may have an electron concentration of not more than $5.0 \times 10^{17}$ cm⁻³. N buffer layer 20 has a smaller thickness than n drift region 10.

P collector layer 22 is in contact with n buffer layer 20, and is provided on the back surface 7b side with respect to n buffer layer 20. P collector layer 22 is provided at back surface 7b of semiconductor substrate 7.

The first semiconductor device further includes first electrode 18 and second electrode 26. First electrode 18 is formed on n⁺ emitter region 12 at front surface 7a. First electrode 18 is also formed on p⁺ contact layer 13 at front surface 7a. First electrode 18 is in contact with n⁺ emitter region 12 and p⁺ contact layer 13. First electrode 18 functions as an emitter electrode. First electrode 18 is electrically connected to p base region 11 with p⁺ contact layer 13 therebetween. First electrode 18 is electrically insulated from gate electrode 16 by an interlayer insulating film 17. Interlayer insulating film 17 is a SiO₂ film, for example.

Second electrode 26 is formed on p collector layer 22. Second electrode 26 is in contact with p collector layer 22. In the present specification, that second electrode 26 is in contact with p collector layer 22 includes that second electrode 26 is in direct contact with p collector layer 22, and that second electrode 26 is in contact with p collector layer 22 with a p contact layer (not shown) therebetween. Second electrode 26 functions as a collector electrode.

P well region 19 is formed between a peripheral end 60 of device region 100, and one of trenches 14 that is closest to peripheral end 60. In a plan view of front surface 7a, peripheral end 60 of device region 100 is peripheral end 60 of first electrode 18. P well region 19 surrounds device region 100 in the plan view of front surface 7a. P well region 19 has a higher hole concentration than p base region 11. P well region 19 has a higher hole concentration than a p anode layer 11a. P well region 19 is in contact with first electrode 18. P well region 19 can improve the breakdown voltage of semiconductor apparatus 1.

P well region 19 is formed to a greater depth than p base region 11 from front surface 7a. P well region 19 covers a corner portion of gate electrode 16 with gate insulating film 15 therebetween. Thus, p well region 19 can relax electric field concentration at the corner portion of gate electrode 16. P well region 19 is formed to a greater depth than p anode layer 11a from front surface 7a.

Device region 100 may further include a second semiconductor device region 102. A second semiconductor device is formed in second semiconductor device region 102. As shown in FIGS. 1 and 2, second semiconductor device region 102 is surrounded by first semiconductor device region 101 in the plan view of front surface 7a and in a plan view of back surface 7b.

The second semiconductor device is a free wheel diode (FWD). The IGBT and the FWD are connected in anti-parallel to each other. During application of a reverse bias voltage to semiconductor apparatus 1, the FWD prevents a current flow into the IGBT. The FWD thus electrically protects the IGBT to prevent breakdown of the IGBT. Semiconductor apparatus 1 is a reverse conducting insulated gate bipolar transistor (RC-IGBT), for example.

As shown in FIG. 3, the second semiconductor device includes n drift region 10, p anode layer 11a, p⁺ contact layer 13, n buffer layer 20, and an n⁺ cathode layer 24.

P anode layer 11a is in contact with n⁻ drift region 10, and is provided on the front surface 7a side with respect to n⁻ drift region 10. P anode layer 11a is made of the same material as p base region 11, for example. P⁺ contact layer 13 is in contact with p anode layer 11a. P⁺ contact layer 13 is formed at front surface 7a. The hole concentration in p⁺ contact layer 13 is higher than a hole concentration in p anode layer 11a.

N buffer layer 20 is in contact with n⁻ drift region 10, and is provided on the back surface 7b side with respect to n⁻ drift region 10. The electron concentration in n buffer layer 20 is higher than the electron concentration in n⁻ drift region 10. N buffer layer 20 has a smaller thickness than n⁻ drift region 10.

N⁺ cathode layer 24 is in contact with n buffer layer 20, and is provided on the back surface 7b side with respect to n buffer layer 20. N⁺ cathode layer 24 is provided at back surface 7b of semiconductor substrate 7. An electron concentration in n⁺ cathode layer 24 is higher than the electron concentration in n buffer layer 20. N⁺ cathode layer 24 has an electron concentration of not less than $1.0 \times 10^{19}$ cm⁻³, for example. N⁺ cathode layer 24 has an electron concentration of not more than $1.0 \times 10^{20}$ cm⁻³, for example. N⁺ cathode layer 24 may be in contact with p collector layer 22.

The second semiconductor device further includes first electrode 18 and second electrode 26. First electrode 18 is formed on p⁺ contact layer 13 at front surface 7a. First electrode 18 is electrically connected to p anode layer 11a with p⁺ contact layer 13 therebetween. First electrode 18 is in contact with p⁺ contact layer 13. First electrode 18 functions as an anode electrode. Second electrode 26 is formed on n⁺ cathode layer 24. Second electrode 26 is in contact with n⁺ cathode layer 24. Second electrode 26 functions as a cathode electrode.

N⁻ drift region 10, n buffer layer 20, p collector layer 22 and second electrode 26 are provided also in peripheral region 103. Specifically, n⁻ drift region 10, n buffer layer 20, p collector layer 22 and second electrode 26 extend from device region 100 to peripheral region 103. P base region 11, p anode layer 11a, n⁺ emitter region 12, p⁺ contact layer 13, gate insulating film 15, gate electrode 16, first electrode 18 and n⁺ cathode layer 24 are not formed in peripheral region 103.

Gate pad 104 is formed on front surface 7a of semiconductor substrate 7 with interlayer insulating film 17 therebetween. Gate pad 104 is connected to gate electrode 16 with a gate wiring (not shown) therebetween. Gate pad 104 and the gate wiring are electrically insulated from first electrode 18.

A field limiting ring (FLR) structure 30 is provided in peripheral region 103 at front surface 7a of semiconductor substrate 7. Field limiting ring structure 30 surrounds device region 100 in the plan view of front surface 7a. Field limiting ring structure 30 includes one or more guard rings 31 and one or more floating electrodes 32. In the present embodiment, field limiting ring structure 30 includes a plurality of guard rings 31 and a plurality of floating electrodes 32.

The plurality of guard rings 31 are provided in peripheral region 103 at front surface 7a of semiconductor substrate 7. Each of the plurality of guard rings 31 surrounds device region 100 in the plan view of front surface 7a. Each of the plurality of guard rings 31 has a higher hole concentration than p base region 11 and p anode layer 11a. The plurality of floating electrodes 32 are provided on the plurality of guard rings 31 exposed at an interlayer insulating film 34, respectively. Interlayer insulating film 34 is a SiO₂ film, for example. The plurality of floating electrodes 32 are in contact with the plurality of guard rings 31, respectively. Each of the plurality of floating electrodes 32 surrounds device region 100 in the plan view of front surface 7a. The plurality of floating electrodes 32 are spaced apart from and electrically insulated from first electrode 18. Field limiting ring structure 30 improves the breakdown voltage of semiconductor apparatus 1.

An n⁺ channel stopper region 33 is provided at front surface 7a of semiconductor substrate 7. N⁺ channel stopper region 33 is formed at a peripheral end 7j of semiconductor substrate 7. Peripheral end 7j of semiconductor substrate 7 is a peripheral end of peripheral region 103. Channel stop electrode 36 is provided on n⁺ channel stopper region 33 exposed at interlayer insulating film 34. Channel stop electrode 36 is in contact with n⁺ channel stopper region 33. Each of n⁺ channel stopper region 33 and channel stop electrode 36 surrounds device region 100 in the plan view of front surface 7a. Channel stopper region 33 prevents a depletion layer extending from a pn junction formed between the plurality of guard rings 31 and n⁻ drift region 10 from reaching peripheral end 7j of semiconductor substrate 7 (peripheral end 60 of peripheral region 103).

An n type region 40 is provided in peripheral region 103 at back surface 7b of semiconductor substrate 7. N type region 40 is in contact with second electrode 26 and n buffer layer 20. N type region 40 has a higher electron concentration than n drift region 10 and n buffer layer 20. N type region 40 has the same electron concentration as n⁺ cathode layer 24, fore example. N type region 40 may have a lower electron concentration than n⁺ cathode layer 24. N type region 40 has an electron concentration of not less than $1.0 \times 10^{18}$ cm⁻³, for example. N type region 40 may have an electron concentration of not less than $1.0 \times 10^{19}$ cm⁻³. N type region 40 has an electron concentration of not more than $1.0 \times 10^{20}$ cm⁻³, for example.

As shown in FIG. 2, n type region 40 is formed as a ring surrounding device region 100 in the plan view of back surface 7b. N type region 40 formed in peripheral region 103 is entirely surrounded by p collector layer 22 in the plan view of back surface 7b. N type region 40 is spaced apart from peripheral end 7j of semiconductor substrate 7 in the plan view of back surface 7b. N type region 40 is spaced apart from peripheral end 60 of device region 100 in the plan view of back surface 7b. Specifically, n type region 40 is spaced apart from peripheral end 60 of device region 100 at least by a distance equal to or greater than a thickness t of semiconductor substrate 7. That is, a distance $d_1$ from peripheral end 60 of device region 100 to n type region 40 is equal to or greater than thickness t of semiconductor substrate 7. Thickness t of semiconductor substrate 7 is defined as the distance between front surface 7a and back surface 7b at peripheral end 60 of device region 100. N type region 40 is not provided directly below p well region 19. N type region 40 is closer to peripheral end 60 of device region 100 than to peripheral end 7j of semiconductor substrate 7 in the plan view of back surface 7b.

A first area ratio of n type region 40 in an inner portion 61 of peripheral region 103 to n type region 40 in peripheral region 103 is greater than a second area ratio of n type region 40 in an outer portion 62 of peripheral region 103 to n type region 40 in peripheral region 103. Inner portion 61 of peripheral region 103 is a portion of peripheral region 103 that is located between peripheral end 60 of device region 100 and an intermediate portion 63 of peripheral region 103. Outer portion 62 of peripheral region 103 is a portion of peripheral region 103 that is located between intermediate portion 63 of peripheral region 103 and peripheral end 7j of semiconductor substrate 7. The distance between intermediate portion 63 of peripheral region 103 and peripheral end 60 of device region 100 is equal to the distance between intermediate portion 63 of peripheral region 103 and peripheral end 7j of semiconductor substrate 7.

The first area ratio is given by dividing the area of n type region 40 in inner portion 61 of peripheral region 103 in the plan view of back surface 7b by the area of n type region 40 in peripheral region 103 in the plan view of back surface 7b. The second area ratio is given by dividing the area of n type region 40 in outer portion 62 of peripheral region 103 in the plan view of back surface 7b by the area of n type region 40 in peripheral region 103 in the plan view of back surface 7b.

An area ratio of n type region 40 to inner portion 61 of peripheral region 103 is greater than an area ratio of n type region 40 to outer portion 62 of peripheral region 103. The area ratio of n type region 40 to inner portion 61 of peripheral region 103 is given by dividing the area of n type region 40 in inner portion 61 of peripheral region 103 in the plan view of back surface 7b by the area of inner portion 61 of peripheral region 103 in the plan view of back surface 7b. The area ratio of n type region 40 to outer portion 62 of peripheral region 103 is given by dividing the area of n type region 40 in outer portion 62 of peripheral region 103 in the plan view of back surface 7b by the area of outer portion 62 of peripheral region 103 in the plan view of back surface 7b.

N buffer layer 20 extends at least from peripheral end 60 of device region 100 to n type region 40. N buffer layer 20 may extend from peripheral end 60 of device region 100 to intermediate portion 63 of peripheral region 103. N buffer layer 20 may extend from peripheral end 60 of device region 100 to peripheral end 7j of semiconductor substrate 7.

In the plan view of back surface 7b, a third area ratio of n type region 40 to peripheral region 103 is smaller than a fourth area ratio of p collector layer 22 to peripheral region 103. The third area ratio is given by dividing the area of n type region 40 in peripheral region 103 in the plan view of back surface 7b by the area of peripheral region 103 in the plan view of back surface 7b. The fourth area ratio is given by dividing the area of p collector layer 22 in peripheral region 103 in the plan view of back surface 7b by the area of peripheral region 103 in the plan view of back surface 7b.

A width w of n type region 40 is smaller than a width $d_2$ of p collector layer 22 in peripheral region 103. Width w of n type region 40 is given as the length of n type region 40 in a direction from the center of semiconductor apparatus 1 to peripheral end 7j of semiconductor substrate 7 in the plan view of back surface 7b. Width $d_2$ of p collector layer 22 is given as the length of p collector layer 22 in the direction from the center of semiconductor apparatus 1 to peripheral end 7j of semiconductor substrate 7 in the plan view of back surface 7b. Width w of n type region 40 is smaller than a width $d_3$ of p collector layer 22 in peripheral region 103 on the inner side relative to n type region 40. Width w of n type region 40 is smaller than a width $d_4$ of p collector layer 22 in peripheral region 103 on the outer side relative to n type region 40. Width $d_2$ is the sum of width $d_3$ and width $d_4$ in the present embodiment. Width w of n type region 40 is not less than 2.0 μm, for example. Width w of n type region 40 may be not less than 4.0 μm. Width w of n type region 40 is not more than 10.0 μm, for example. The width of n type region 40 may be not more than 8.0 μm.

Referring to FIGS. 4 to 9, an example of a method of manufacturing semiconductor apparatus 1 according to the first embodiment is described.

Figure 4:
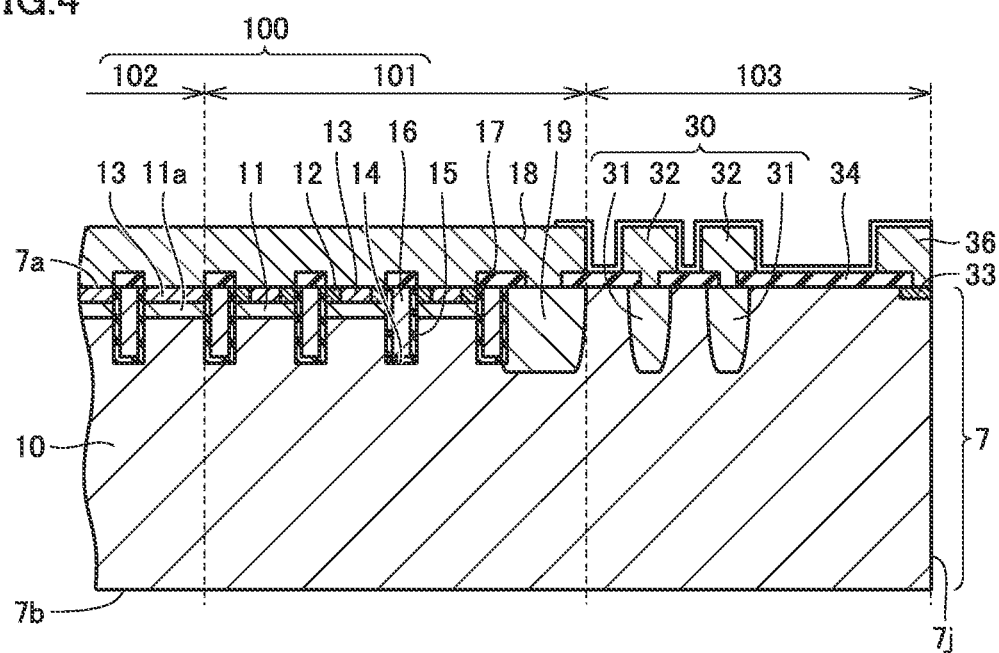
FIG. 4 is a schematic partially-enlarged sectional view showing a step of a method of manufacturing the semiconductor apparatus according to the first embodiment.

As shown in FIG. 4, semiconductor substrate 7 having the structure on the front surface 7a side of semiconductor apparatus 1 formed thereon is prepared. Specifically, p base region 11, p anode layer 11a, n$^+$ emitter region 12, p$^+$ contact layer 13, trench 14, gate insulating film 15, gate electrode 16, and p well region 19 are formed by a known method on the front surface 7a side in device region 100 of semiconductor substrate 7 (n drift region 10). Interlayer insulating film 17 and first electrode 18 are formed by a known method on front surface 7a in device region 100 of semiconductor substrate 7. First electrode 18 is in contact with n$^+$ emitter region 12 and p$^+$ contact layer 13. Field limiting ring structure 30 and interlayer insulating film 34 are formed by a known method on the front surface 7a side in peripheral region 103 of semiconductor substrate 7 (n$^-$ drift region 10). Field limiting ring structure 30 is spaced apart from and electrically insulated from first electrode 18.

Back surface 7b of semiconductor substrate 7 is processed to reduce the thickness of semiconductor substrate 7 (n$^-$ drift region 10). In one example, back surface 7b of semiconductor substrate 7 may be ground with a grinder, or may be wet etched. The thickness of semiconductor substrate 7 is reduced to a thickness of not less than 3 μm and not more than 800 μm, without being particularly limited thereto.

Figure 5:
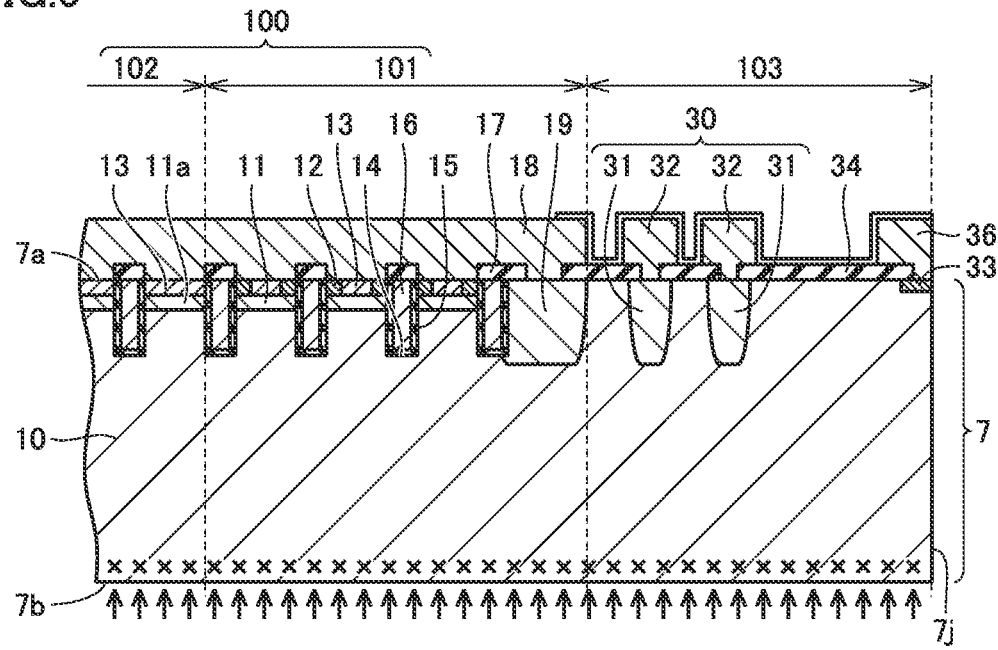
FIG. 5 is a schematic partially-enlarged sectional view showing a step subsequent to the step shown in FIG. 4 in the method of manufacturing the semiconductor apparatus according to the first embodiment.
Figure 6:
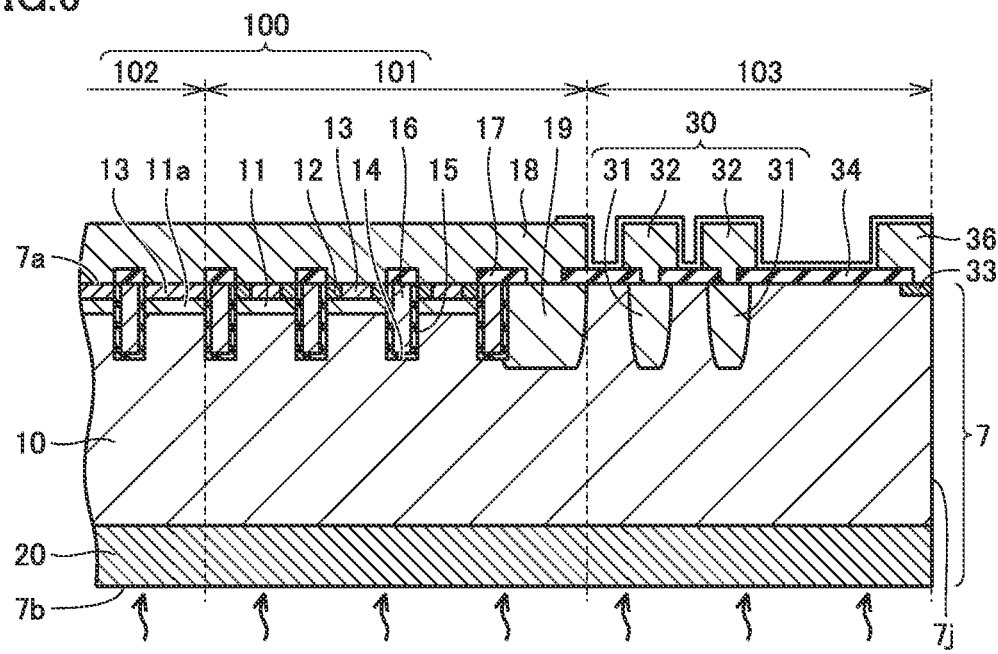
FIG. 6 is a schematic partially-enlarged sectional view showing a step subsequent to the step shown in FIG. 5 in the method of manufacturing the semiconductor apparatus according to the first embodiment.

As shown in FIG. 5, back surface 7b is doped with an n type dopant. The n type dopant is phosphorus, arsenic or proton, for example. The n type dopant is doped into back surface 7b using an ion implantation device, for example. As shown in FIG. 6, semiconductor substrate 7 doped with the n type dopant is annealed to activate the n type dopant doped into semiconductor substrate 7. N buffer layer 20 is thus formed at back surface 7b. N buffer layer 20 is in contact with n$^-$ drift region 10, and is formed on the back surface 7b side with respect to n$^-$ drift region 10. N buffer layer 20 is formed in device region 100 and peripheral region 103.

Figure 7:
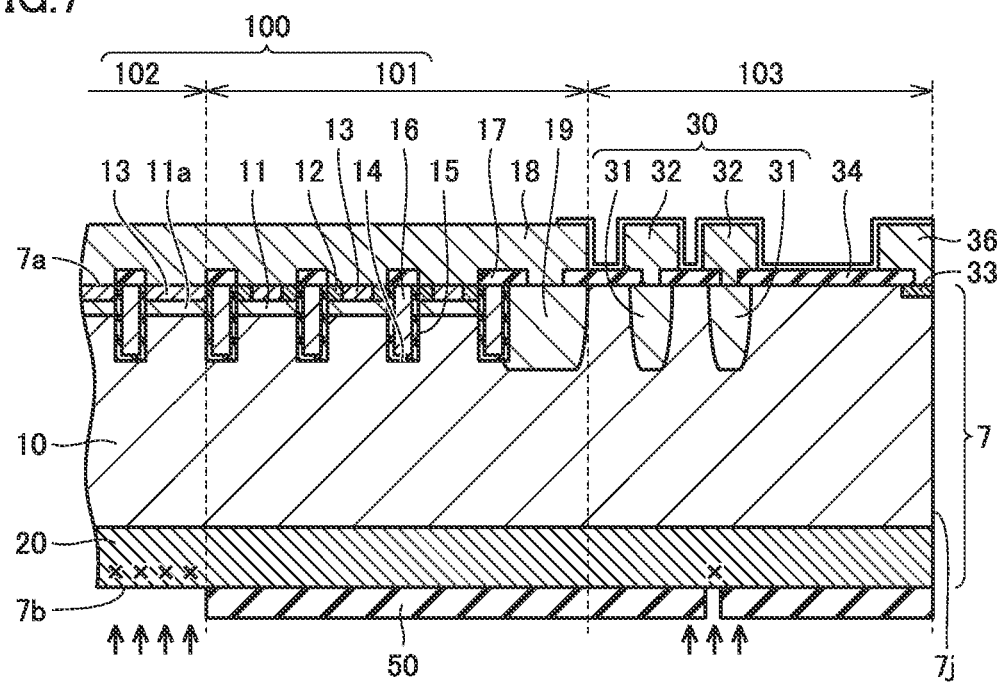
FIG. 7 is a schematic partially-enlarged sectional view showing a step subsequent to the step shown in FIG. 6 in the method of manufacturing the semiconductor apparatus according to the first embodiment.

As shown in FIG. 7, a mask 50 with openings is formed on back surface 7b. A portion of back surface 7b is doped with an n type dopant. The n type dopant is phosphorus, arsenic or proton, for example. The n type dopant is doped into a portion of back surface 7b using an ion implantation device, for example. The portion of back surface 7b includes a portion of back surface 7b where n$^+$ cathode layer 24 is to be formed, and a portion of back surface 7b where n type region 40 is to be formed.

Figure 8:
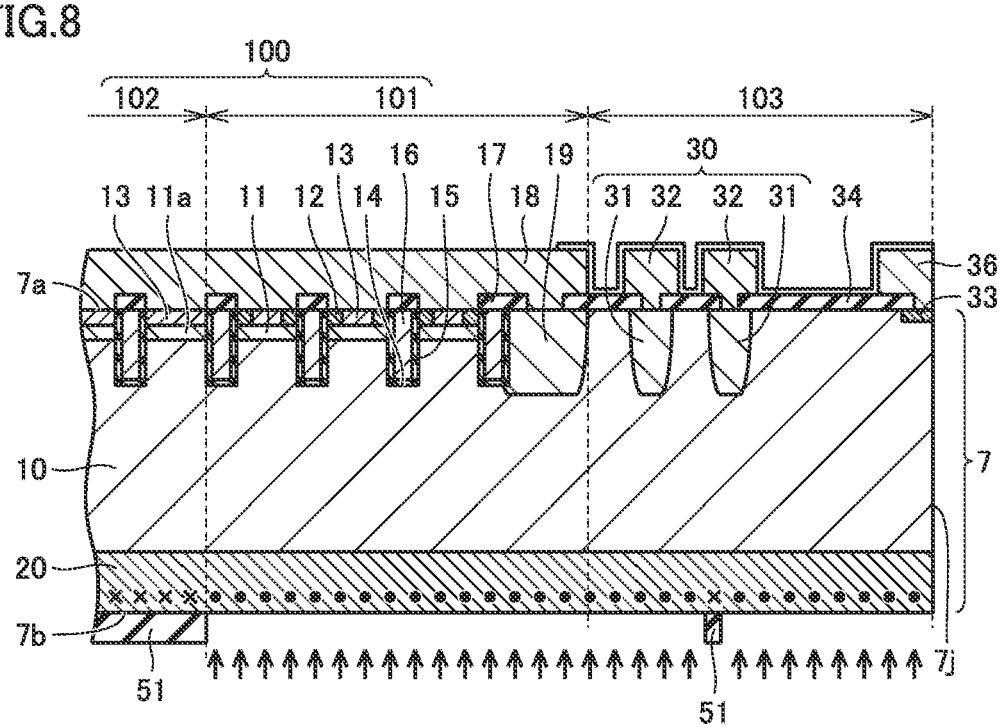
FIG. 8 is a schematic partially-enlarged sectional view showing a step subsequent to the step shown in FIG. 7 in the method of manufacturing the semiconductor apparatus according to the first embodiment.

As shown in FIG. 8, a mask 51 with openings is formed on back surface 7b. A portion of back surface 7b is doped with a p type dopant. The p type dopant is boron, for example. The p type dopant is doped into a portion of back surface 7b using an ion implantation device, for example. The portion of back surface 7b is a portion of back surface 7b where p collector layer 22 is to be formed.

Figure 9:
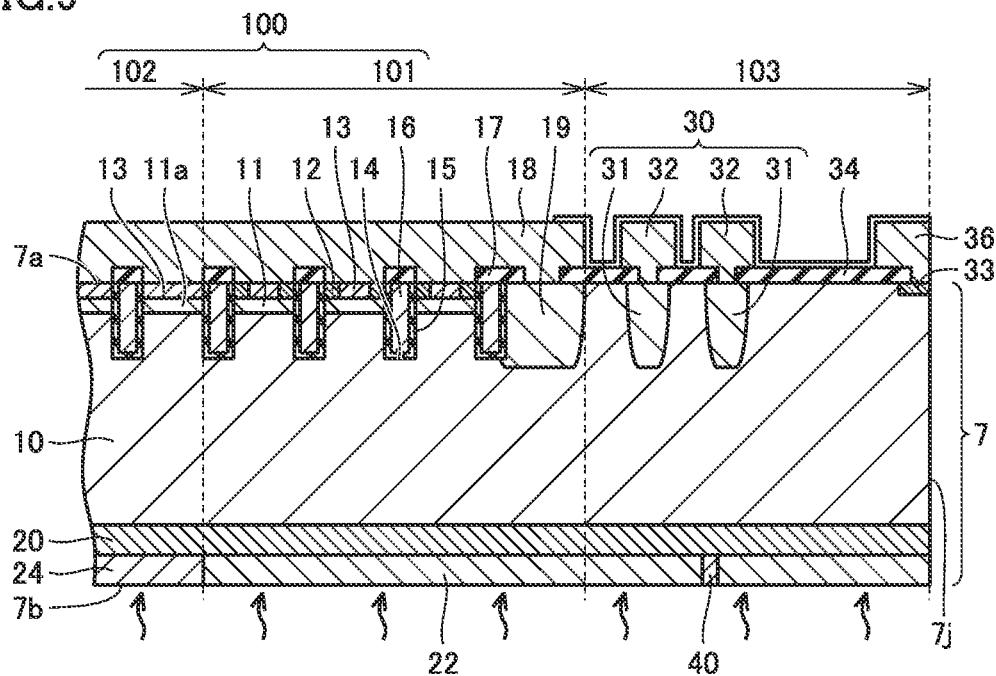
FIG. 9 is a schematic partially-enlarged sectional view showing a step subsequent to the step shown in FIG. 8 in the method of manufacturing the semiconductor apparatus according to the first embodiment.

As shown in FIG. 9, semiconductor substrate 7 doped with the n type dopant and the p type dopant is annealed to activate the n type dopant and the p type dopant doped into semiconductor substrate 7. N$^+$ cathode layer 24, p collector layer 22 and n type region 40 are thus formed at back surface 7b. N$^+$ cathode layer 24 is in contact with n buffer layer 20, and is formed on the back surface 7b side with respect to n buffer layer 20. N$^+$ cathode layer 24 is formed at back surface 7b. P collector layer 22 is in contact with n buffer layer 20, and is formed on the back surface 7b side with respect to n buffer layer 20. P collector layer 22 is formed at back surface 7b. N type region 40 is in contact with n buffer layer 20, and is formed on the back surface 7b side with respect to n buffer layer 20. N type region 40 is formed in peripheral region 103 at back surface 7b. N type region 40 formed in peripheral region 103 is entirely surrounded by p collector layer 22 in the plan view of back surface 7b.

Lastly, second electrode 26 is formed on p collector layer 22, n+ cathode layer 24 and n type region 40. Second electrode 26 is a laminated film of Al/Ti/Ni/Au or a laminated film of AlSi/Ti/Ni/Au, for example. Semiconductor substrate 7 having second electrode 26 formed thereon may be annealed such that second electrode 26 makes ohmic contact with n+ cathode layer 24, p collector layer 22 and n type region 40. In this manner, semiconductor apparatus 1 of the present embodiment shown in FIGS. 1 to 3 is obtained.

First, the reason why a turn-off loss of semiconductor apparatus 1 decreases is explained along with the description of operation of semiconductor apparatus 1.

A voltage higher than a threshold voltage is applied to gate electrode 16, and a higher voltage is applied to second electrode 26 than to first electrode 18, to turn the first semiconductor device (IGBT) into an ON state. The second semiconductor device (FWD) is in an OFF state during this time.

The application of the voltage higher than the threshold voltage to gate electrode 16 forms a channel at portion 11c of p base region 11. Electrons flow from n+ emitter region 12 into n− drift region 10. A forward bias voltage is applied to a pn junction between p collector layer 22 and n buffer layer 20, causing holes to flow from p collector layer 22 into n− drift region 10. Electrons and holes are thus accumulated at high concentrations in n− drift region 10. Conductivity modulation occurs in n− drift region 10, significantly reducing the resistance of n− drift region 10. This significantly reduces an ON voltage of the first semiconductor device (voltage between first electrode 18 and second electrode 26 in an ON state of the first semiconductor device).

In an ON state of the first semiconductor device, some of the holes flowing from p collector layer 22 also flow into a portion of n− drift region 10 in peripheral region 103, and are accumulated also in the portion of n− drift region 10 in peripheral region 103. Since p collector layer 22 is in contact over a large area with second electrode 26, the voltage of the p collector is substantially equal to the voltage applied to second electrode 26. N type region 40 is in contact with second electrode 26 and n buffer layer 20 in peripheral region 103. In peripheral region 103, n type region 40 brings the voltage of n buffer layer 20 closer to the voltage applied to second electrode 26. In peripheral region 103, n type region 40 reduces the forward bias voltage applied to the pn junction between p collector layer 22 and n buffer layer 20. N type region 40 reduces the amount of holes flowing into peripheral region 103 in an ON state of the first semiconductor device. N type region 40 reduces the amount of holes accumulated in peripheral region 103 in an ON state of the first semiconductor device.

Then, a voltage lower than the threshold voltage is applied to gate electrode 16, to effect a transition from an ON state to an OFF state of the first semiconductor device. The electrons and holes accumulated in n− drift region 10 in an ON state of the first semiconductor device are discharged from n− drift region 10 during a turn-off process of the first semiconductor device (process of transition from an ON state to an OFF state of the first semiconductor device). As mentioned above, n type region 40 reduces the amount of holes accumulated in peripheral region 103 in an ON state of the first semiconductor device. N type region 40 reduces the amount of holes to be discharged from peripheral region 103 during the turn-off process of the first semiconductor device. Semiconductor apparatus 1 can thus reduce the turn-off loss.

In contrast, a semiconductor apparatus of a comparative example does not include n type region 40. Therefore, the forward bias voltage applied to the pn junction between p collector layer 22 and n buffer layer 20 in an ON state of the first semiconductor device cannot be reduced. The amount of holes to be discharged from peripheral region 103 during the turn-off process of the semiconductor apparatus of the comparative example does not decrease. The semiconductor apparatus of the comparative example has a higher turn-off loss.

In semiconductor apparatus 1, the first area ratio of n type region 40 in inner portion 61 of peripheral region 103 to n type region 40 in peripheral region 103 is greater than the second area ratio of n type region 40 in outer portion 62 of peripheral region 103 to n type region 40 in peripheral region 103. N buffer layer 20 has electrical resistance. Thus, the difference between the voltage of a portion in n buffer layer 20 and the voltage applied to second electrode 26 increases with an increasing distance of the portion in n buffer layer 20 from n type region 40. Since p collector layer 22 is in contact over a large area with second electrode 26, the voltage of the p collector is substantially equal to the voltage applied to second electrode 26. A forward bias voltage applied to a pn junction between p collector layer 22 and the portion in n buffer layer 20 increases with an increasing distance of the portion in n buffer layer 20 from n type region 40. In addition, holes tend to flow into peripheral region 103 toward peripheral end 60 of device region 100. N buffer layer 20 suppresses the aforementioned increase in the forward bias voltage in inner portion 61 of peripheral region 103 into which the holes tend to flow. The amount of holes to be discharged from peripheral region 103 during the turn-off process of the first semiconductor device decreases. Semiconductor apparatus 1 can thus reduce the turn-off loss.

In semiconductor apparatus 1, n buffer layer 20 has a higher electron concentration than n− drift region 10. N buffer layer 20 has low electrical resistance. Thus, n buffer layer 20 suppresses the increase in the forward bias voltage applied to the pn junction between p collector layer 22 and the portion inn buffer layer 20 with an increasing distance of the portion in n buffer layer 20 from n type region 40. The amount of holes to be discharged from peripheral region 103 during the turn-off process of the first semiconductor device decreases. Semiconductor apparatus 1 can thus reduce the turn-off loss.

Next, the reason why a recovery loss of semiconductor apparatus 1 decreases during a recovery process of semiconductor apparatus 1 is explained. The recovery process of semiconductor apparatus 1 is a process of transition from a first state in which a higher voltage is applied to first electrode 18 than to second electrode 26 to a second state in which a higher voltage is applied to second electrode 26 than to first electrode 18.

During application of a higher voltage to first electrode 18 than to second electrode 26, the first semiconductor device (IGBT) is in an OFF state. However, p anode layer 11a, p base region 11 and p well region 19, n− drift region 10, n buffer layer 20 and n type region 40 form a parasitic diode. Thus, some of the holes flowing from first electrode 18 to second electrode 26 in the first state also flow into peripheral region 103.

However, since n type region 40 is formed in peripheral region 103, a path for carriers (electrons, holes) flowing in this parasitic diode increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, in the plan view of back surface 7b, the third area ratio of n type region 40 to peripheral region 103 is smaller than the fourth area ratio of p collector layer 22 to peripheral region 103. Due to the small area of n type region 40, the internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, n type region 40 is spaced apart from peripheral end 60 of device region 100 at least by the distance equal to or greater than thickness t of semiconductor substrate 7. Thickness t of semiconductor substrate 7 is defined as the distance between front surface 7a and back surface 7b at peripheral end 60 of device region 100. Thus, the path for carriers (electrons, holes) flowing in the parasitic diode increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In a first modification of the present embodiment, p well region 19 may be omitted.

In a second modification of the present embodiment, first semiconductor device region 101 may be surrounded by second semiconductor device region 102 in the plan view of back surface 7b. P well region 19 has a higher hole concentration than p anode layer 11a, and p well region 19 is formed to a greater depth than p anode layer 11a from front surface 7a. Thus, holes tend to flow in p well region 19 during the recovery process of the second semiconductor device (FWD). In the present embodiment, second semiconductor device region 102 is surrounded by first semiconductor device region 101 in the plan view of back surface 7b, whereby the second semiconductor device (FWD) can be further separated from p well region 19 than in the second modification of the present embodiment. In the present embodiment, the amount of holes to be discharged from peripheral region 103 during the recovery process of the second semiconductor device is lower than in the second modification of the present embodiment. The recovery loss is smaller in the present embodiment than in the second modification of the present embodiment.

The effect of semiconductor apparatus 1 of the present embodiment is described.

Semiconductor apparatus 1 of the present embodiment includes semiconductor substrate 7 having front surface 7a and back surface 7b, first electrode 18 provided on front surface 7a, and second electrode 26 provided on back surface 7b.

Semiconductor substrate 7 includes device region 100 including the first semiconductor device, and peripheral region 103 surrounding device region 100. The first semiconductor device includes $n^-$ drift region 10, p base region 11, $n^+$ emitter region 12, gate insulating film 15, gate electrode 16, n buffer layer 20, and p collector layer 22. $N^+$ emitter region 12 is in contact with first electrode 18. Gate insulating film 15 is provided on portion 11c of p base region 11 between $n^+$ emitter region 12 and $n^-$ drift region 10. Gate electrode 16 faces portion 11c of p base region 11 with gate insulating film 15 interposed therebetween. N buffer layer 20 is in contact with n drift region 10, and is provided on the back surface 7b side with respect tori drift region 10. P collector layer 22 is in contact with n buffer layer 20 and second electrode 26, and is provided on the back surface 7b side with respect to n buffer layer 20.

$N^-$ drift region 10, n buffer layer 20 and second electrode 26 extend from device region 100 to peripheral region 103. P collector layer 22 is provided also in peripheral region 103. Peripheral region 103 is provided with n type region 40. N type region 40 is in contact with second electrode 26 and n buffer layer 20. The first area ratio of n type region 40 in inner portion 61 of peripheral region 103 to n type region 40 in peripheral region 103 is greater than the second area ratio of n type region 40 in outer portion 62 of peripheral region 103 to n type region 40 in peripheral region 103.

N type region 40 is in contact with second electrode 26 and n buffer layer 20 in peripheral region 103. Thus, in peripheral region 103, n type region 40 reduces the forward bias voltage applied to the pn junction between p collector layer 22 and n buffer layer 20. In addition, the first area ratio of n type region 40 in inner portion 61 of peripheral region 103 to n type region 40 in peripheral region 103 is greater than the second area ratio of n type region 40 in outer portion 62 of peripheral region 103 to n type region 40 in peripheral region 103. N buffer layer 20 suppresses, in inner portion 61 of peripheral region 103 into which the holes tend to flow during an ON state of the first semiconductor device, the increase in the forward bias voltage applied to the pn junction between p collector layer 22 and the portion in n buffer layer 20 with an increasing distance of the portion in n buffer layer 20 from n type region 40. Moreover, n buffer layer 20 has a higher electron concentration than n drift region 10. N buffer layer 20 suppresses the increase in the forward bias voltage applied to the pn junction between p collector layer 22 and the portion in n buffer layer 20 with an increasing distance of the portion in n buffer layer 20 from n type region 40.

In this manner, n type region 40 reduces the amount of holes flowing into peripheral region 103 in an ON state of the first semiconductor device. N type region 40 reduces the amount of holes to be discharged from peripheral region 103 during the turn-off process of the first semiconductor device. Semiconductor apparatus 1 can thus reduce the turn-off loss.

In addition, since n type region 40 is formed in peripheral region 103, the path for carriers (electrons, holes) flowing in the parasitic diode formed of p base region 11, n drift region 10, n buffer layer 20 and n type region 40 increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, n type region 40 has a higher electron concentration than n buffer layer 20. Thus, the electrical resistance of n type region 40 decreases, whereby the voltage of n buffer layer 20 can be brought closer to the voltage applied to second electrode 26. The forward bias voltage applied to the pn junction between p collector layer 22 and n buffer layer 20 decreases. N type region 40 reduces the amount of holes flowing into peripheral region 103 in an ON state of the first semiconductor device. N type region 40 reduces the amount of holes to be discharged from peripheral region 103 during the turn-off process of the first semiconductor device. Semiconductor apparatus 1 can thus reduce the turn-off loss.

In semiconductor apparatus 1 of the present embodiment, n type region 40 is spaced apart from peripheral end 60 of device region 100 at least by the distance equal to or greater than thickness t of semiconductor substrate 7. Thickness t of semiconductor substrate 7 is defined as the distance between front surface 7a and back surface 7b at peripheral end 60 of device region 100.

Holes tend to flow into peripheral region 103 toward peripheral end 60 of device region 100, and therefore tend to flow into the portion of n type region 40 located at a distance of thickness t of semiconductor substrate 7 from peripheral end 60 of device region 100. However, n type region 40 in contact with n buffer layer 20 can bring the voltage of a portion of n buffer layer 20 at least over the distance equal to or greater than thickness t of semiconductor substrate 7 from peripheral end 60 of device region 100 closer to the voltage of p collector layer 22. The forward bias voltage applied to the pn junction between p collector layer 22 and n buffer layer 20 decreases. N type region 40 reduces the amount of holes flowing into peripheral region 103 in an ON state of the first semiconductor device. N type region 40 reduces the amount of holes to be discharged from peripheral region 103 during the turn-off process of the first semiconductor device. Semiconductor apparatus 1 can thus reduce the turn-off loss.

In addition, n type region 40 is spaced apart from peripheral end 60 of device region 100 at least by the distance equal to or greater than thickness t of semiconductor substrate 7. Thus, the path for carriers (electrons, holes) flowing in the parasitic diode formed of p base region 11, n⁻ drift region 10, n buffer layer 20 and n type region 40 increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, n type region 40 formed in peripheral region 103 is entirely surrounded by p collector layer 22 in the plan view of back surface 7b. Holes tend to flow into peripheral region 103 toward peripheral end 60 of device region 100. However, since n type region 40 formed in peripheral region 103 is entirely surrounded by p collector layer 22, n type region 40 is separated from peripheral end 60 of device region 100. In addition, n type region 40 is only formed in a portion of peripheral region 103. Thus, the amount of holes flowing into peripheral region 103 in the first state is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, in the plan view of back surface 7b, the third area ratio of n type region 40 to peripheral region 103 is smaller than the fourth area ratio of p collector layer 22 to peripheral region 103. Due to the small area of n type region 40, the internal resistance of the parasitic diode formed of p base region 11, n⁻ drift region 10, n buffer layer 20 and n type region 40 increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of semiconductor apparatus 1 is small. The recovery loss of semiconductor apparatus 1 is thus small.

In semiconductor apparatus 1 of the present embodiment, n type region 40 is formed as a ring surrounding device region 100 in the plan view of back surface 7b. N type region 40 reduces, in all directions in which device region 100 extends, the amount of holes to be discharged from peripheral region 103 during the turn-off process of the first semiconductor device. Semiconductor apparatus 1 can thus reduce the turn-off loss.

In semiconductor apparatus 1 of the present embodiment, device region 100 further includes the second semiconductor device. The second semiconductor device includes p anode layer 11a provided on the front surface 7a side with respect to n drift region 10, and n⁺ cathode layer 24 provided on the back surface 7b side with respect to n⁻ drift region 10. P anode layer 11a, n⁻ drift region 10 and n⁺ cathode layer 24 form a FWD. During application of a reverse bias voltage to semiconductor apparatus 1, the second semiconductor device prevents a current flow into the first semiconductor device. The second semiconductor device thus electrically protects the first semiconductor device to prevent breakdown of the first semiconductor device.

In addition, since n type region 40 is formed in peripheral region 103, the path for carriers (electrons, holes) flowing in the parasitic diode formed of p base region 11 and p anode layer 11a, n drift region 10, n buffer layer 20 and n type region 40 increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of the second semiconductor device is small. The recovery loss of semiconductor apparatus 1 is thus small.

In semiconductor apparatus 1 of the present embodiment, n type region 40 is spaced apart from peripheral end 60 of device region 100 at least by the distance equal to or greater than thickness t of semiconductor substrate 7. Thickness t of semiconductor substrate 7 is defined as the distance between front surface 7a and back surface 7b at peripheral end 60 of device region 100. Thus, the path for carriers (electrons, holes) flowing in the parasitic diode formed of p base region 11 and p anode layer 11a, n⁻ drift region 10, n buffer layer 20 and n type region 40 increases in length. The internal resistance of the parasitic diode increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of the second semiconductor device is small. The recovery loss of semiconductor apparatus 1 is thus small.

In semiconductor apparatus 1 of the present embodiment, in the plan view of back surface 7b, the third area ratio of n type region 40 to peripheral region 103 is smaller than the fourth area ratio of p collector layer 22 to peripheral region 103. Due to the small area of n type region 40, the internal resistance of the parasitic diode formed of p base region 11 and p anode layer 11a, n drift region 10, n buffer layer 20 and n type region 40 increases. In the first state in which a higher voltage is applied to first electrode 18 than to second electrode 26, the amount of carriers flowing in the parasitic diode is small, and the amount of holes flowing into peripheral region 103 is small. The amount of holes to be discharged from peripheral region 103 during the recovery process of the second semiconductor device is small. The recovery loss of semiconductor apparatus 1 is thus small.

Second Embodiment

Figure 10:
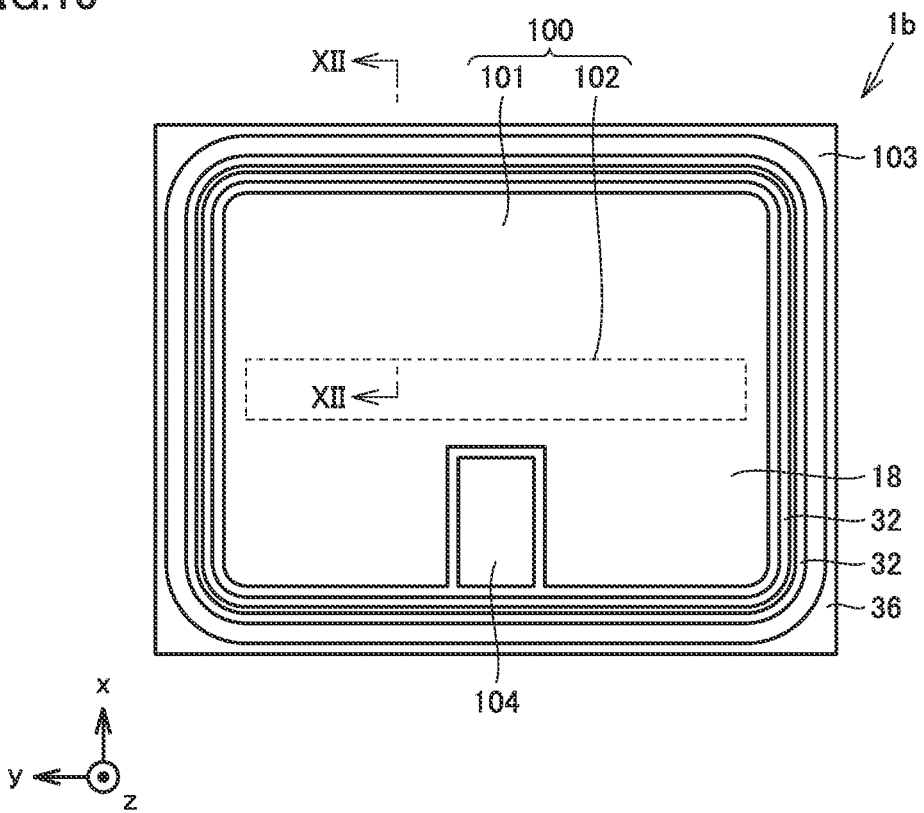
FIG. 10 is a schematic plan view of a semiconductor apparatus according to a second embodiment.
Figure 11:
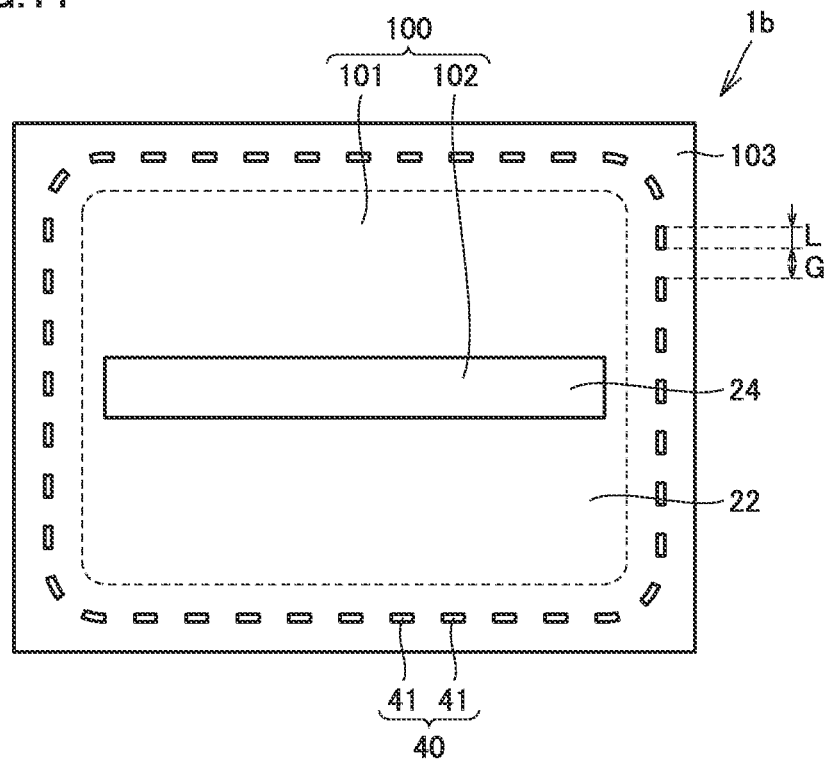
FIG. 11 is a schematic bottom view of the semiconductor apparatus according to the second embodiment.
Figure 12:
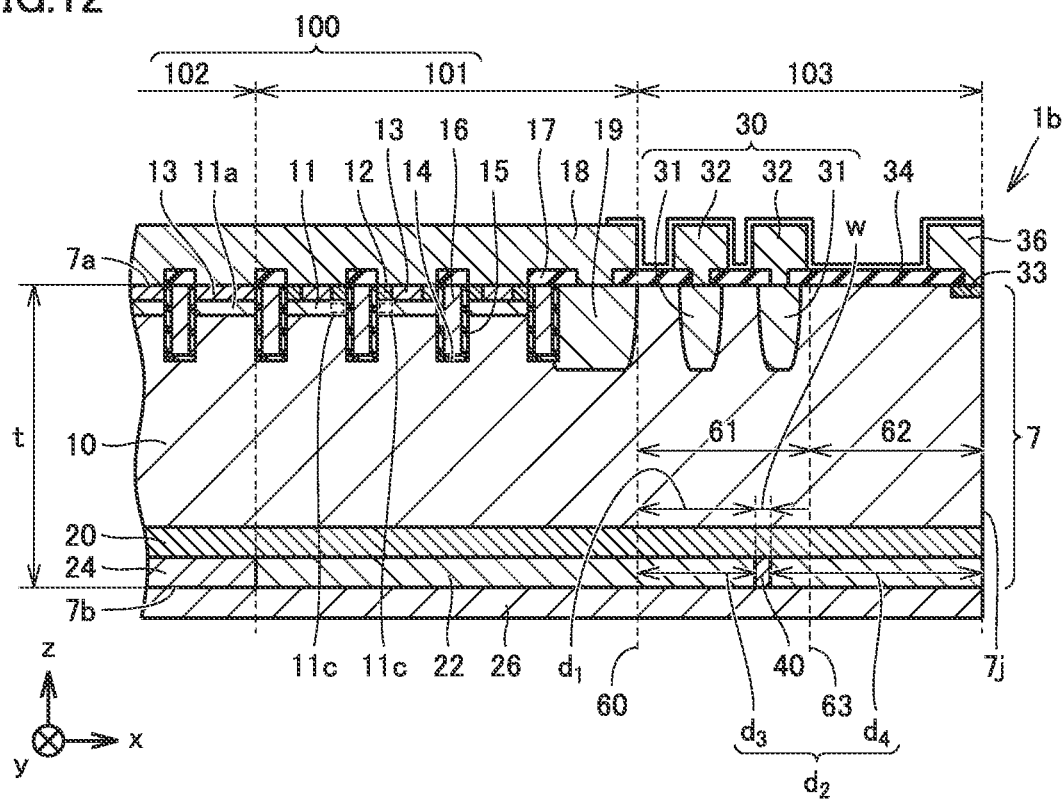
FIG. 12 is a schematic partially-enlarged sectional view of the semiconductor apparatus according to the second embodiment, which is taken along a section line XII-XII shown in FIG. 10.

Referring to FIGS. 10 to 12, a semiconductor apparatus 1b according to a second embodiment is described. Semiconductor apparatus 1b has a similar configuration and produces a similar effect to semiconductor apparatus 1 of the first embodiment, but is different mainly on the following points.

In semiconductor apparatus 1b, n type region 40 includes a plurality of n type region portions 41 in the plan view of back surface 7b. The plurality of n type region portions 41 are arranged discretely in peripheral region 103. The plurality of n type region portions 41 are formed in a dashed line in peripheral region 103, for example. The plurality of n type region portions 41 may be formed as dots in peripheral region 103. A longitudinal length L of each n type region portion 41 may be smaller than a spacing G between two adjacent n type region portions 41. In the present embodiment, the third area ratio of n type region 40 to peripheral region 103 is lower than in the first embodiment. Thus, the recovery loss of semiconductor apparatus 1b can be further reduced.

Third Embodiment

Figure 13:
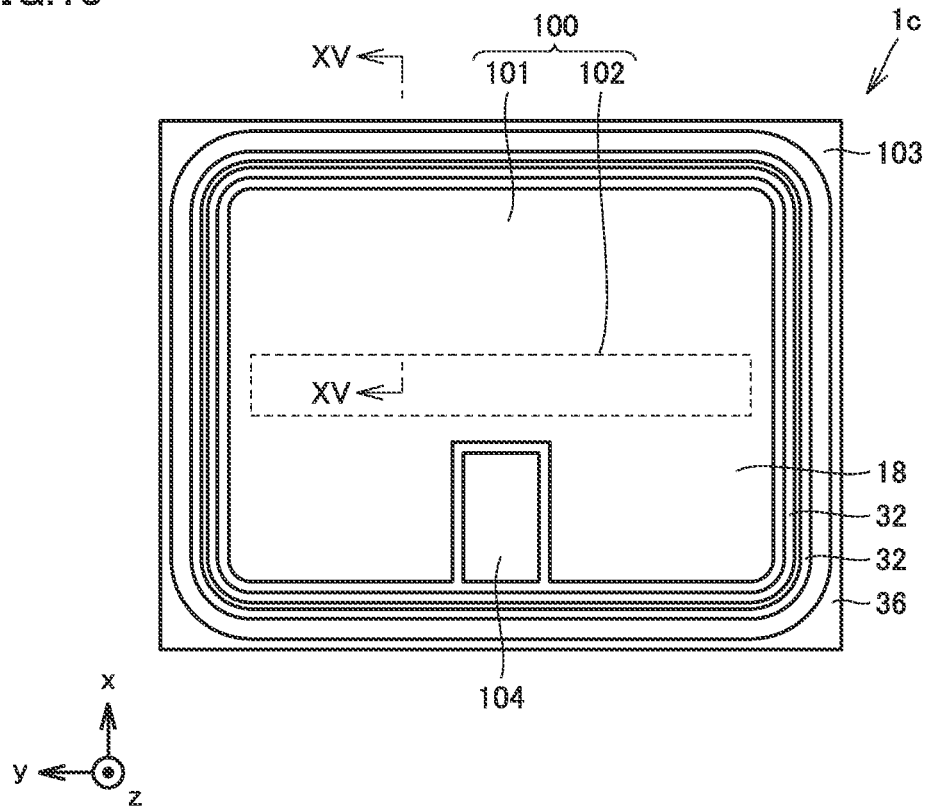
FIG. 13 is a schematic plan view of a semiconductor apparatus according to a third embodiment.
Figure 14:
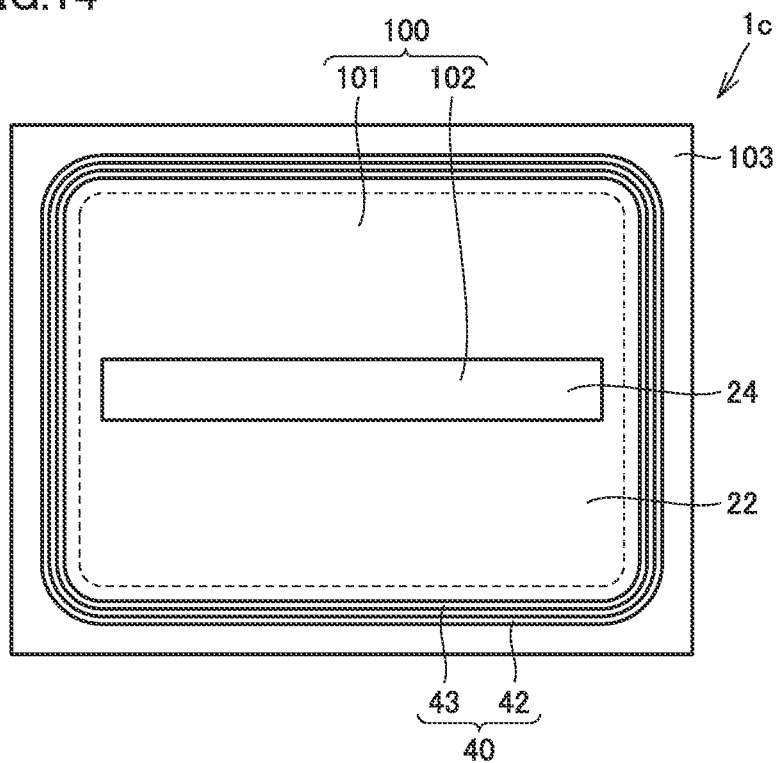
FIG. 14 is a schematic bottom view of the semiconductor apparatus according to the third embodiment.
Figure 15:
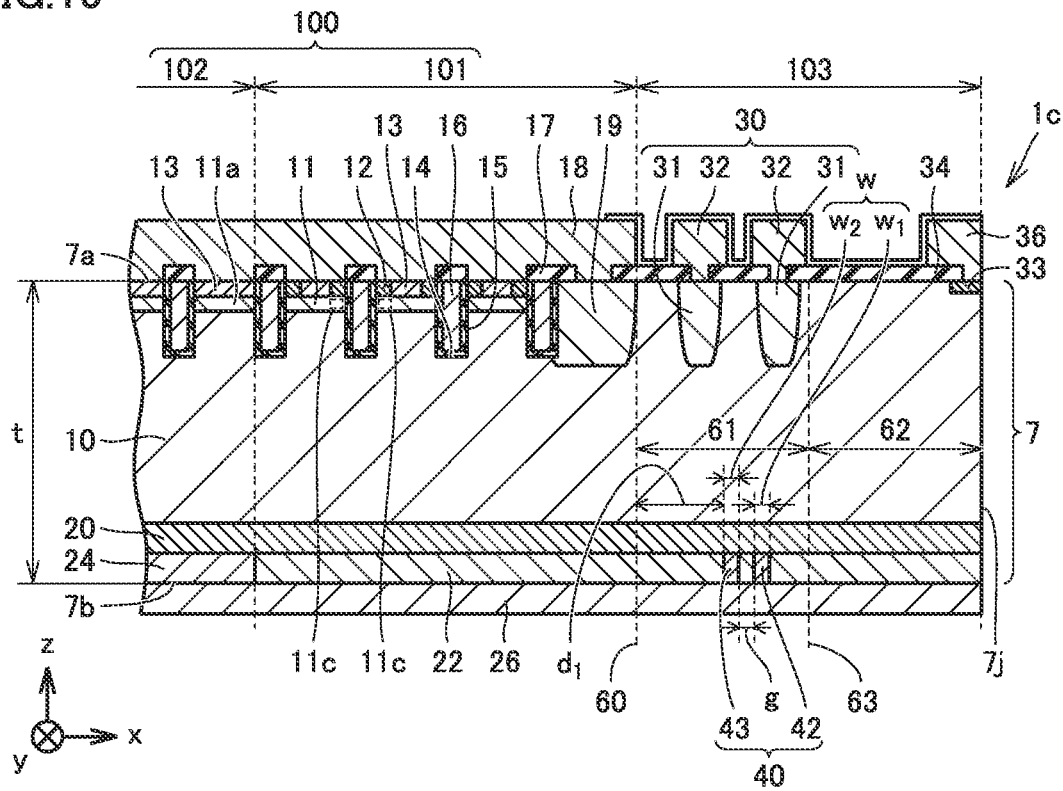
FIG. 15 is a schematic partially-enlarged sectional view of the semiconductor apparatus according to the third embodiment, which is taken along a section line XV-XV shown in FIG. 13.

Referring to FIGS. 13 to 15, a semiconductor apparatus 1c according to a third embodiment is described. Semiconductor apparatus 1c has a similar configuration and produces a similar effect to semiconductor apparatus 1 of the first embodiment, but is different mainly on the following points.

In semiconductor apparatus 1c of the present embodiment, n type region 40 is formed as a plurality of rings surrounding device region 100 in the plan view of back surface 7b. Specifically, n type region 40 includes a plurality of n type region portions 42 and 43. Each of the plurality of n type region portions 42 and 43 surrounds device region 100. The plurality of n type region portions 42 and 43 are arranged discretely in peripheral region 103. The plurality of n type region portions 42 and 43 are spaced apart from each other. N type region portion 42 is formed at the same position as n type region 40 of the first embodiment. N type region portion 43 is formed on the inner side relative to n type region portion 42 (closer to peripheral end 60 of device region 100).

N type region portion 42 has a width $w_1$, and n type region portion 43 has a width $w_2$. Width w of n type region 40 is the sum of width $w_1$ and width $w_2$. Width $w_1$ of n type region portion 42 is equal to width $w_2$ of n type region portion 43, for example. Width $w_1$ of n type region portion 42 may be greater than or smaller than width $w_2$ of n type region portion 43. Width $w_1$ of n type region portion 42 is smaller than a spacing g between two adjacent n type region portions 42 and 43. Width $w_2$ of n type region portion 43 is smaller than spacing g between two adjacent n type region portions 42 and 43. In a modification of the present embodiment, each of the plurality of n type region portions 42 and 43 may be formed as in the second embodiment.

In the present embodiment, the third area ratio of n type region 40 to peripheral region 103 is higher, and n type region 40 is formed closer to peripheral end 60 of device region 100, than in the first embodiment. Thus, the turn-off loss of semiconductor apparatus 1c can be further reduced.

Fourth Embodiment

Figure 16:
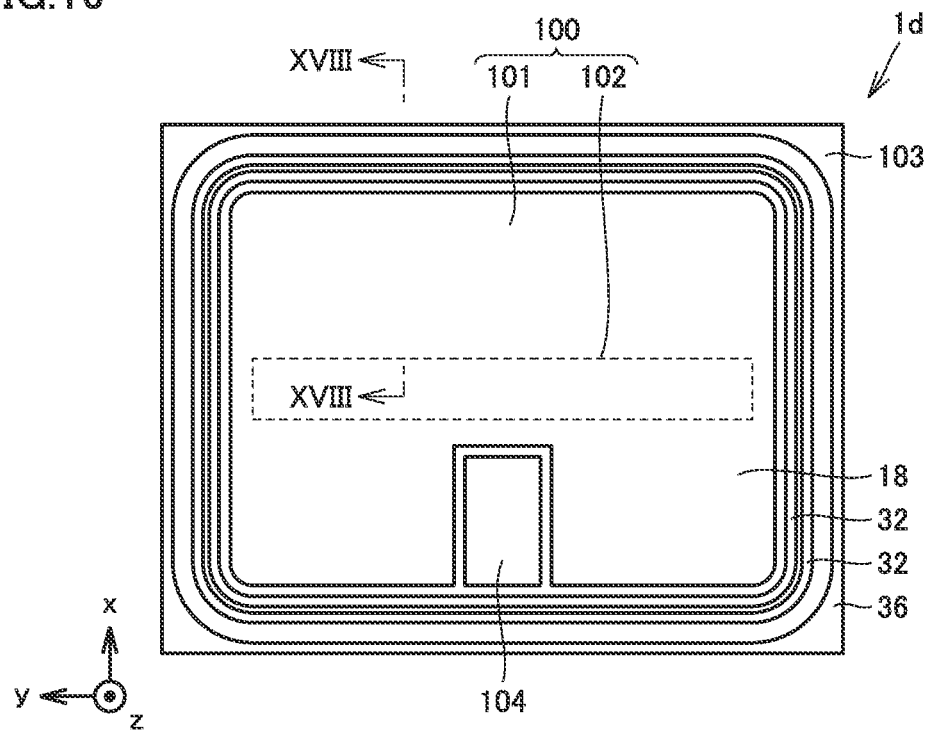
FIG. 16 is a schematic plan view of the semiconductor apparatus according to the fourth embodiment.
Figure 17:
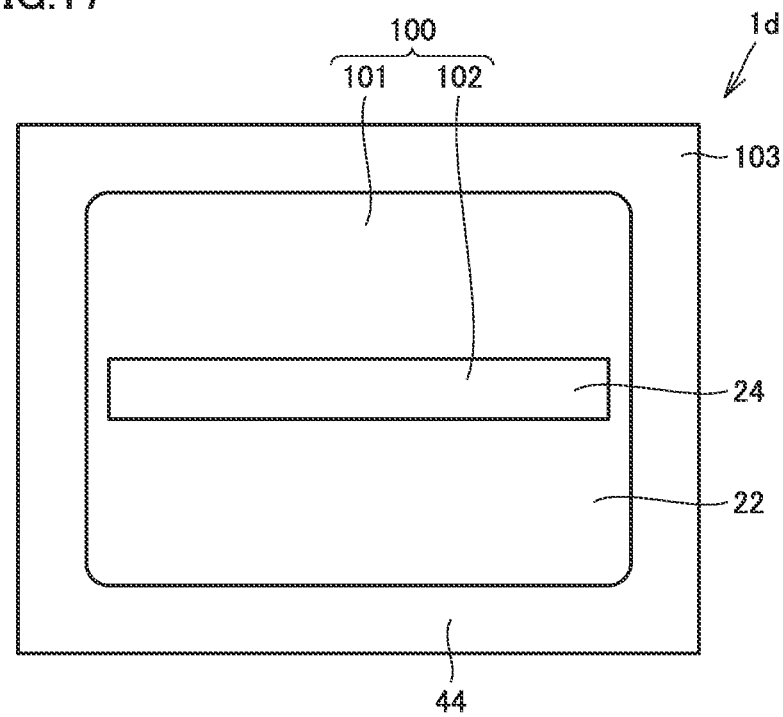
FIG. 17 is a schematic bottom view of the semiconductor apparatus according to the fourth embodiment.
Figure 18:
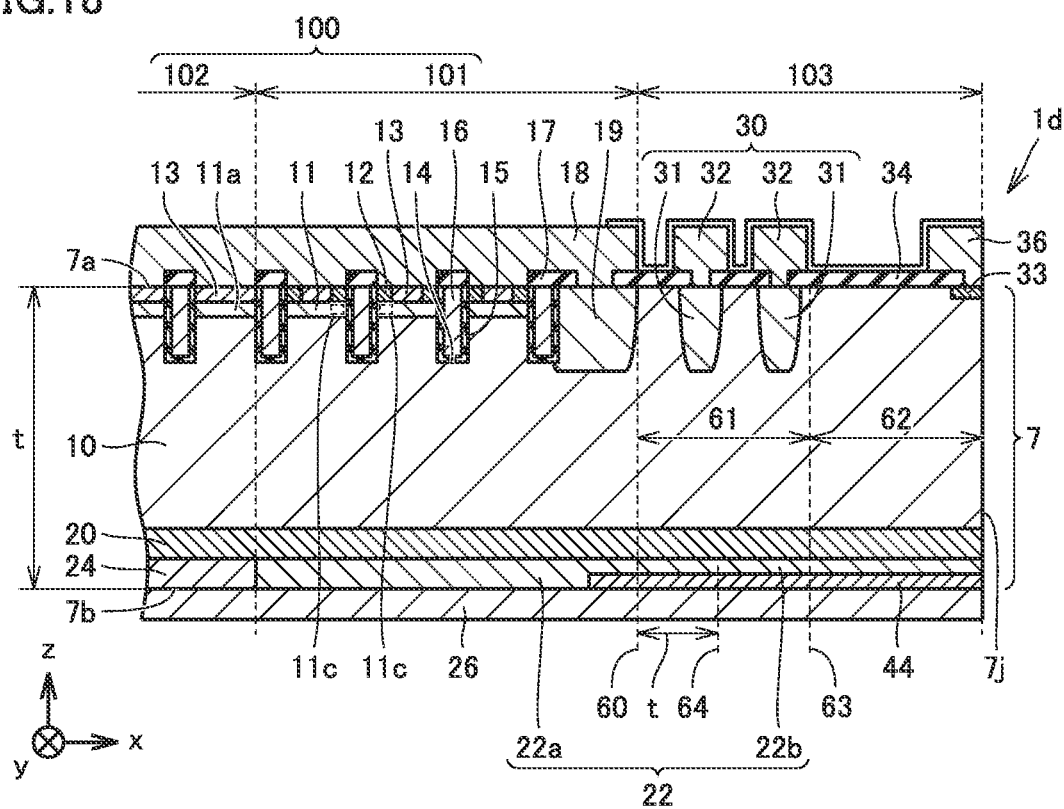
FIG. 18 is a schematic partially-enlarged sectional view of the semiconductor apparatus according to the fourth embodiment, which is taken along a section line XVIII-XVIII shown in FIG. 16.

Referring to FIGS. 16 to 18, a semiconductor apparatus 1d according to a fourth embodiment is described. Semiconductor apparatus 1d of the present embodiment has a similar configuration to semiconductor apparatus 1 of the first embodiment, but is different mainly on the following points.

In semiconductor apparatus 1d, peripheral region 103 is provided with an n type region 44, instead of n type region 40 of the first embodiment. N type region 44 has a lower electron concentration than $n^+$ cathode layer 24. N type region 44 has a higher electron concentration than $n^+$ drift region 10. N type region 44 has an electron concentration of not less than $1.0 \times 10^{18}$ cm$^{-3}$, for example. N type region 44 has an electron concentration of not more than $1.0 \times 10^{20}$ cm$^{-3}$, for example.

In semiconductor apparatus 1d, p collector layer 22 includes a first p collector portion 22a and a second p collector portion 22b. Second p collector portion 22b may have a lower hole concentration than first p collector portion 22a. Second p collector portion 22b has a hole concentration of not less than $1.0 \times 10^{16}$ cm$^{-3}$, for example. Second p collector portion 22b has a hole concentration of not more than $1.0 \times 10^{18}$ cm$^{-3}$, for example. Second p collector portion 22b has a thickness of not less than 0.20 µm and not more than 1.00 µm, for example.

N type region 44 is in contact with second electrode 26. Second p collector portion 22b is between n buffer layer 20 and n type region 44. Second p collector portion 22b is in contact with n buffer layer 20 and n type region 44. A first pn junction is formed between second p collector portion 22b and n type region 44. A second pn junction is formed between second p collector portion 22b and n buffer layer 20. N type region 44, second p collector portion 22b and n buffer layer 20 function as an npn transistor.

N type region 44 extends at least from peripheral end 60 of device region 100 to a first portion 64 of peripheral region 103. First portion 64 is spaced apart from peripheral end 60 by thickness t of semiconductor substrate 7. Thickness t of semiconductor substrate 7 is defined as the distance between front surface 7a and back surface 7b at peripheral end 60 of device region 100. N type region 44 may extend from peripheral end 60 of device region 100 to intermediate portion 63 of peripheral region 103. N type region 44 may extend from peripheral end 60 of device region 100 to peripheral end 7j of semiconductor substrate 7. N type region 44 may further extend from peripheral end 60 of device region 100 to a portion of device region 100.

Referring to FIGS. 4 to 6 and 19 to 24, a first example of a method of manufacturing semiconductor apparatus 1d of the present embodiment is described. The first example of the method of manufacturing semiconductor apparatus 1d of the present embodiment includes similar steps to the method of manufacturing semiconductor apparatus 1 of the first embodiment, but is different mainly on the following points.

Figure 19:
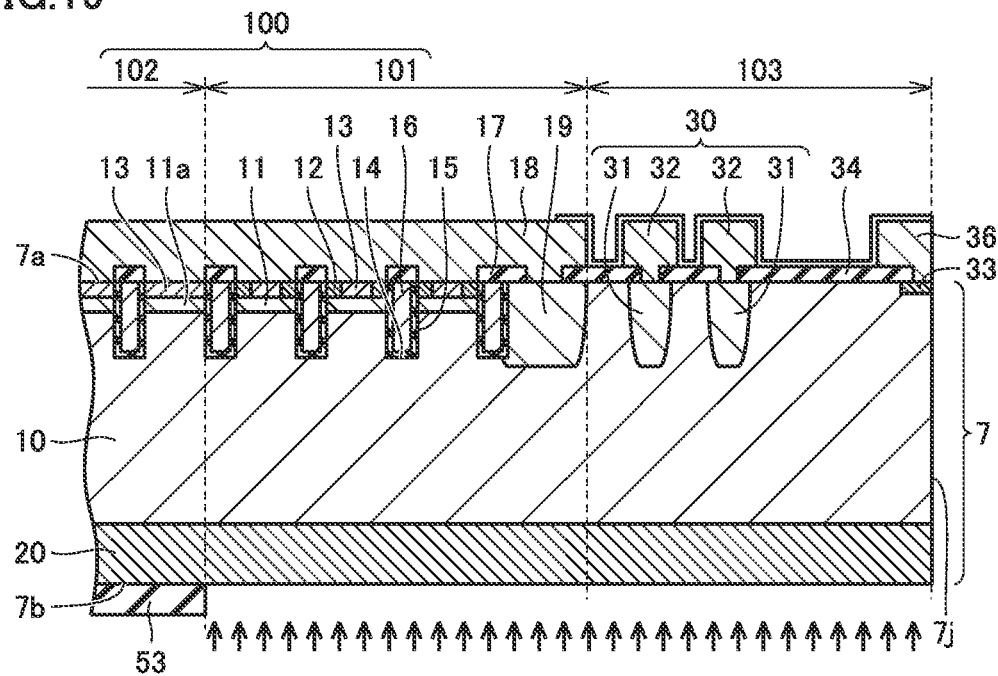
FIG. 19 is a schematic partially-enlarged sectional view showing a step subsequent to the step shown in FIG. 6 in a first example and a second example of the method of manufacturing the semiconductor apparatus according to the fourth embodiment.
Figure 20:
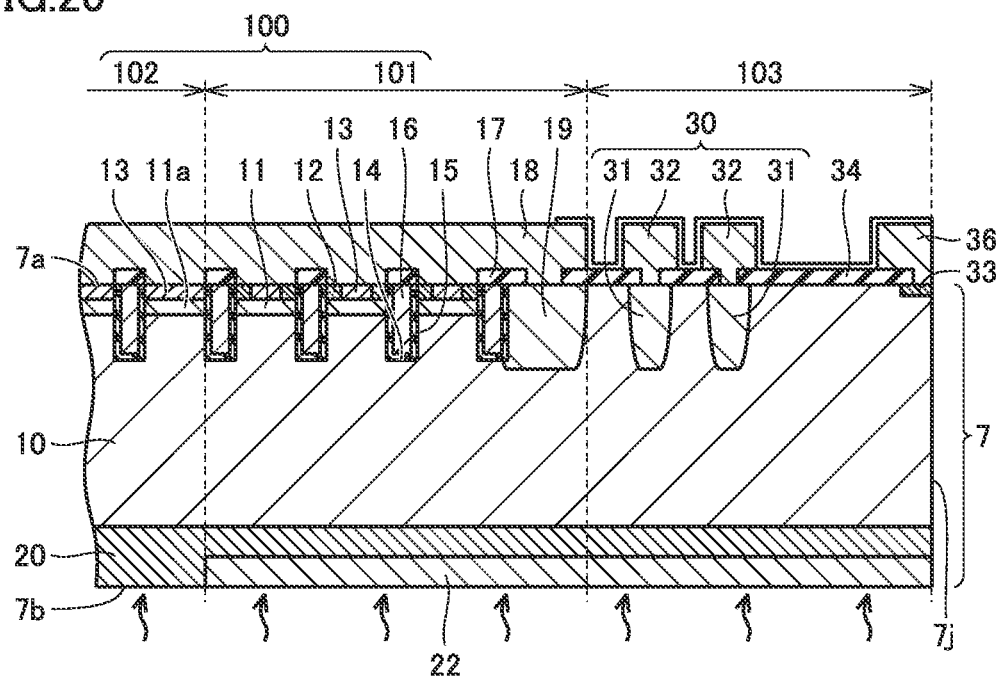
FIG. 20 is a schematic partially-enlarged sectional view showing a step subsequent to the step shown in FIG. 19 in the first example and the second example of the method of manufacturing the semiconductor apparatus according to the fourth embodiment.

After the step shown in FIG. 6, a mask 53 with an opening is formed on back surface 7b as shown in FIG. 19. A portion of back surface 7b is doped with a p type dopant. The p type dopant is boron, for example. The p type dopant is doped into a portion of back surface 7b using an ion implantation device, for example. The portion of back surface 7b is a portion of back surface 7b where p collector layer 22 is to be formed. As shown in FIG. 20, semiconductor substrate 7 doped with the p type dopant is annealed to activate the p type dopant doped into semiconductor substrate 7. P collector layer 22 is thus formed at back surface 7b. P collector layer 22 is in contact with n buffer layer 20. P collector layer 22 is formed in the first semiconductor device region and peripheral region 103 at back surface 7b. P collector layer 22 is not formed in second semiconductor device region 102.

Figure 21:
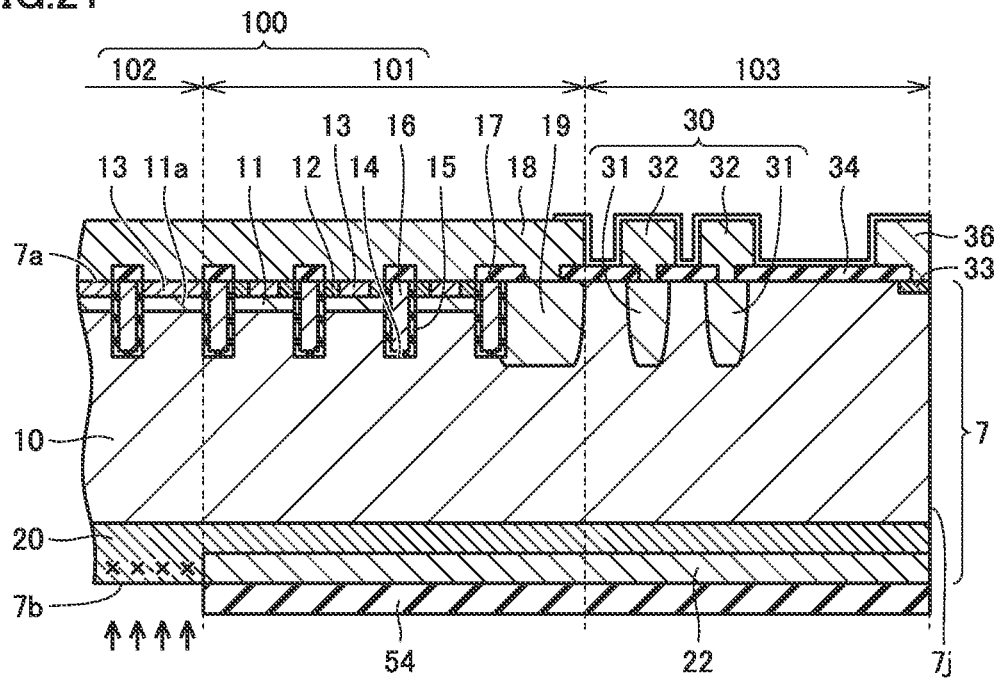
FIG. 21 is a schematic partially-enlarged sectional view showing a step subsequent to the step shown in FIG. 20 in the first example of the method of manufacturing the semiconductor apparatus according to the fourth embodiment.
Figure 22:
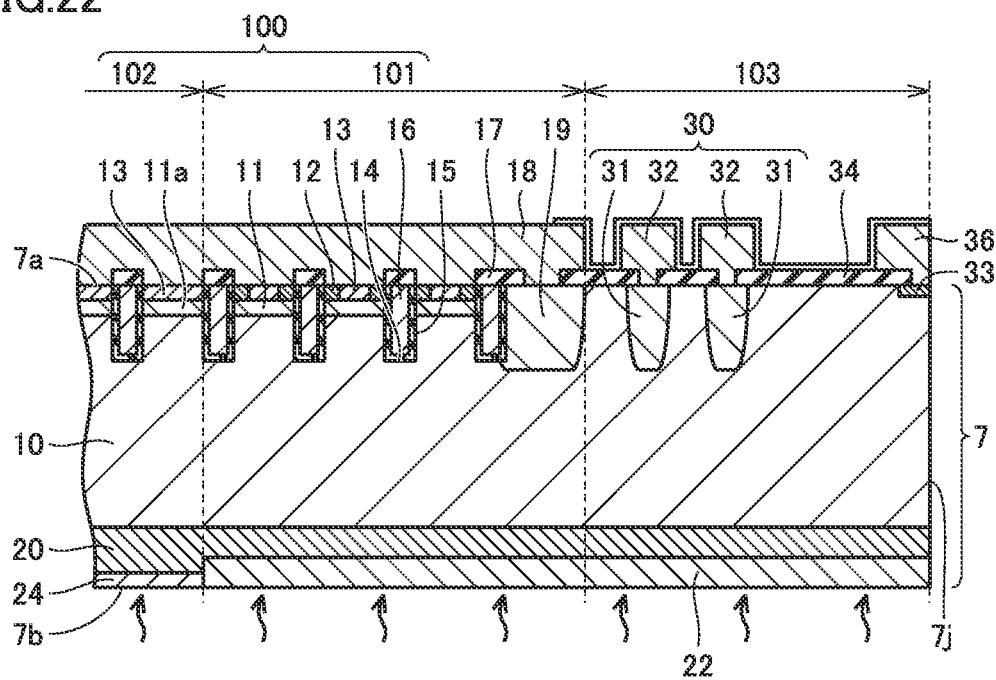
FIG. 22 is a schematic partially-enlarged sectional view showing a step subsequent to the step shown in FIG. 21 in the first example of the method of manufacturing the semiconductor apparatus according to the fourth embodiment.

As shown in FIG. 21, a mask 54 with an opening is formed on back surface 7b. A portion of back surface 7b is doped with an n type dopant. The n type dopant is phosphorus, arsenic or proton, for example. The n type dopant is doped into a portion of back surface 7b using an ion implantation device, for example. The portion of back surface 7b is a portion of back surface 7b where $n^+$ cathode layer 24 is to be formed. As shown in FIG. 22, semiconductor substrate 7 doped with the n type dopant is annealed to activate the n type dopant doped into semiconductor substrate 7.

Figure 23:
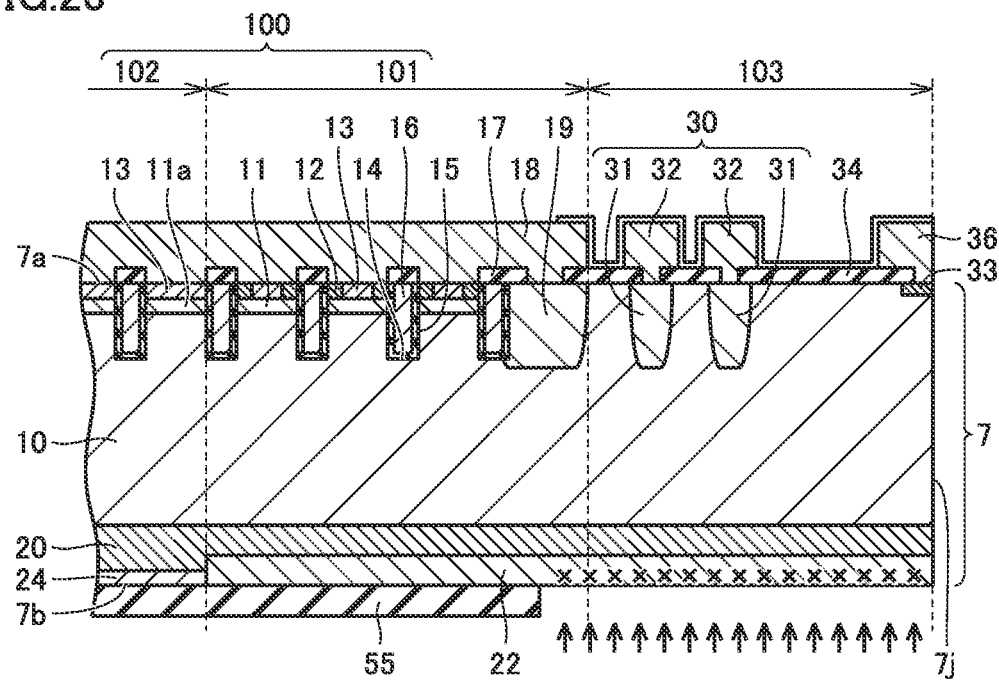
FIG. 23 is a schematic partially-enlarged sectional view showing a step subsequent to the step shown in FIG. 22 in the first example of the method of manufacturing the semiconductor apparatus according to the fourth embodiment.
Figure 24:
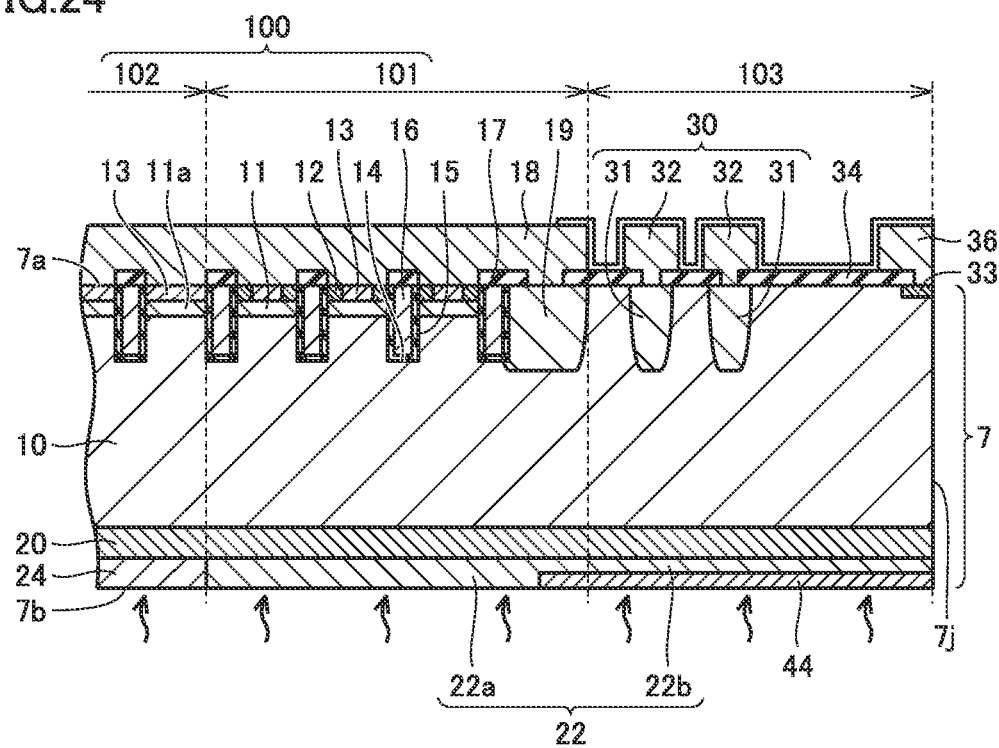
FIG. 24 is a schematic partially-enlarged sectional view showing a step subsequent to the step shown in FIG. 23 in the first example of the method of manufacturing the semiconductor apparatus according to the fourth embodiment.

As shown in FIG. 23, a mask 55 with an opening is formed on back surface 7b. A portion of back surface 7b is doped with an n type dopant. The n type dopant is phosphorus, arsenic or proton, for example. The n type dopant is doped into a portion of back surface 7b using an ion implantation device, for example. The portion of back surface 7b is a portion of back surface 7b where n type region 44 is to be formed. As shown in FIG. 24, semiconductor substrate 7 doped with the n type dopant is annealed to activate the n type dopant doped into semiconductor substrate 7. $N^+$ cathode layer 24 and n type region 44 are thus formed at back surface 7b.

The hole concentration in p collector layer 22 formed in the steps shown in FIGS. 19 and 20 increases with a decreasing distance from back surface 7b. In steps shown in FIGS. 25 and 26, n type region 44 is formed in a portion of p collector layer 22 that is closer to back surface 7b. This makes the hole concentration in second p collector portion 22b lower than the hole concentration in first p collector portion 22a. Lastly, second electrode 26 is formed on p collector layer 22, $n^+$ cathode layer 24 and n type region 44. In this manner, semiconductor apparatus 1d of the present embodiment shown in FIGS. 16 to 18 is obtained.

Referring to FIGS. 4 to 6, 19, 20, 25 and 26, a second example of the method of manufacturing semiconductor apparatus 1d of the present embodiment is described. The second example of the method of manufacturing semiconductor apparatus 1d of the present embodiment includes similar steps to the method of manufacturing semiconductor apparatus 1 of the first embodiment, but is different mainly on the following points.

Figure 25:
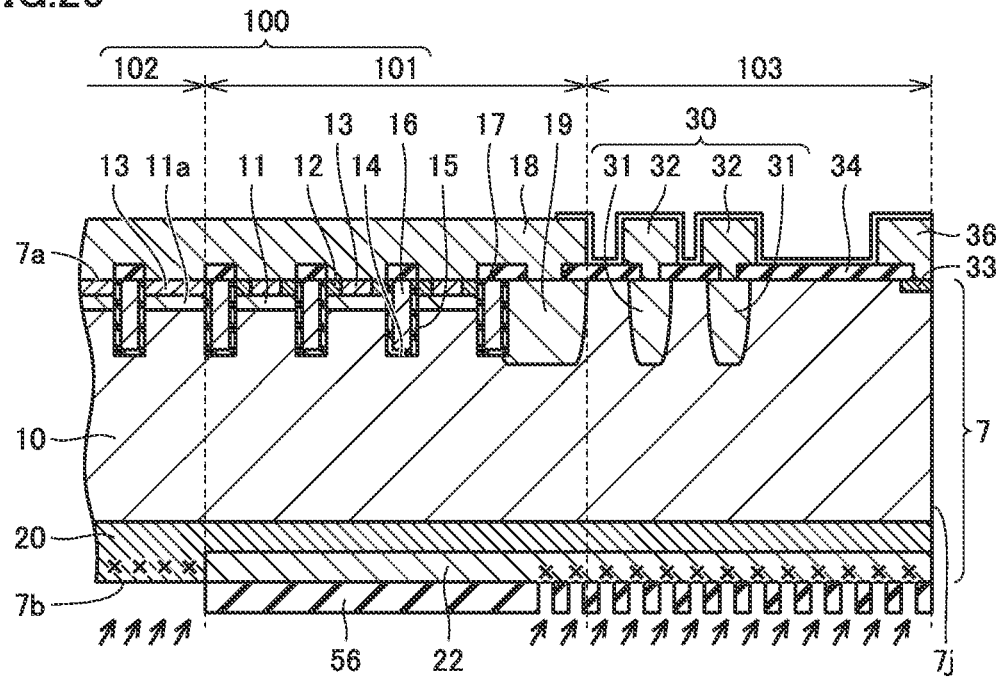
FIG. 25 is a schematic partially-enlarged sectional view showing a step subsequent to the step shown in FIG. 20 in the second example of the method of manufacturing the semiconductor apparatus according to the fourth embodiment.

After the step shown in FIG. 20, a mask 56 with openings is formed on back surface 7b as shown in FIG. 25. Mask 56 is provided with a large opening through which to entirely expose the portion where $n^+$ cathode layer 24 is to be formed, and a plurality of minute openings through which to partially expose the portion where n type region 44 is to be formed.

A portion of back surface 7b is doped with an n type dopant. The n type dopant is phosphorus, arsenic or proton, for example. The n type dopant is doped into a portion of back surface 7b using an ion implantation device, for example. The n type dopant is implanted into back surface 7b in a direction oblique to back surface 7b. Mask 56 provided with the plurality of minute openings has been formed on the portion where n type region 44 is to be formed. Thus, mask 56 prevents the n type dopant toward the portion where n type region 44 is to be formed from partially reaching back surface 7b. A smaller amount of n type dopant is implanted into the portion where n type region 44 is to be formed than into the portion where $n^+$ cathode layer 24 is to be formed.

Figure 26:
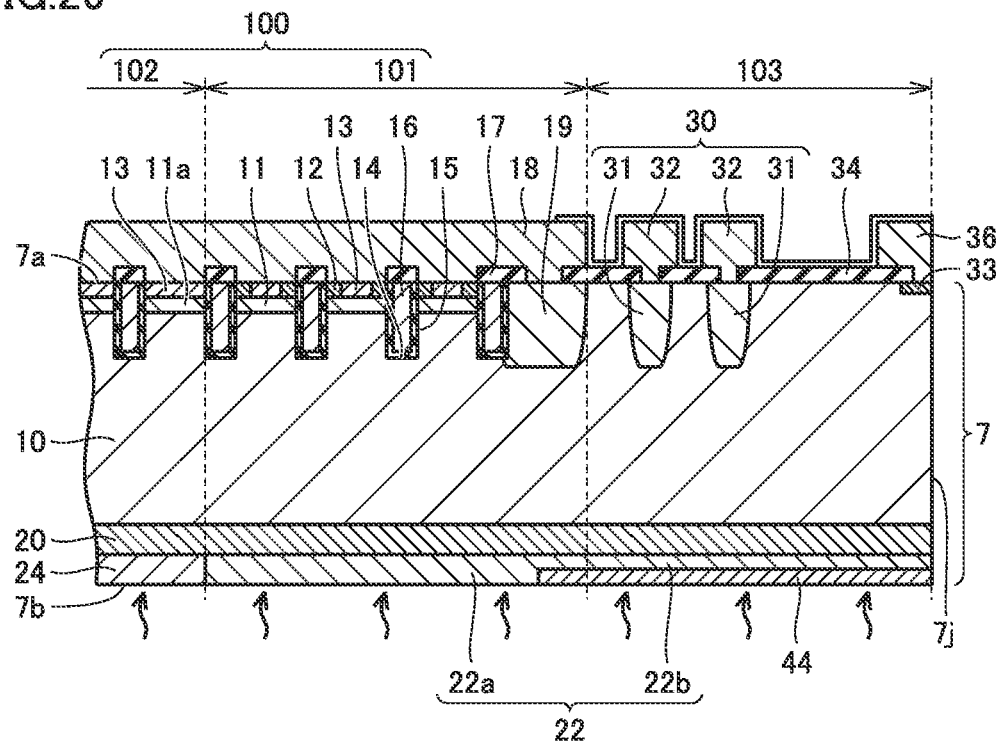
FIG. 26 is a schematic partially-enlarged sectional view showing a step subsequent to the step shown in FIG. 25 in the second example of the method of manufacturing the semiconductor apparatus according to the fourth embodiment.

As shown in FIG. 26, semiconductor substrate 7 doped with the n type dopant is annealed to activate the n type dopant doped into semiconductor substrate 7. $N^+$ cathode layer 24 and n type region 44 are thus formed at back surface 7b. Lastly, second electrode 26 is formed on p collector layer 22. In this manner, semiconductor apparatus 1d of the present embodiment shown in FIGS. 16 to 18 is obtained. The second example of the method of manufacturing semiconductor apparatus 1d of the present embodiment can provide semiconductor apparatus 1d with fewer steps than the first example of the method of manufacturing semiconductor apparatus 1d of the present embodiment.

First, the reason why a turn-off loss of semiconductor apparatus 1d decreases is explained along with the description of operation of semiconductor apparatus 1d.

A voltage higher than a threshold voltage is applied to gate electrode 16, and a higher voltage is applied to second electrode 26 than to first electrode 18, to turn the first semiconductor device (IGBT) into an ON state. The second semiconductor device (FWD) is in an OFF state during this time.

First p collector portion 22a and n type region 44 are in contact over a large area with second electrode 26. Each of the voltage of the first p collector and the voltage of n type region 44 is substantially equal to the voltage applied to second electrode 26. However, second p collector portion 22b is not in contact with second electrode 26. P collector layer 22 has electrical resistance. During the application of a higher voltage to second electrode 26 than to first electrode 18, the voltage of second p collector portion 22b is lower than the voltage of first p collector portion 22a.

In this manner, a reverse bias voltage is applied to the first pn junction formed between second p collector portion 22b and n type region 44. The npn transistor formed of n type region 44, second p collector portion 22b and n buffer layer 20 interrupts the flow of carriers (electrons, holes). The amount of holes flowing into peripheral region 103 during an ON state of the first semiconductor device decreases significantly. The amount of holes to be discharged from peripheral region 103 during the turn-off process of the first semiconductor device decreases significantly. Semiconductor apparatus 1d can thus reduce the turn-off loss.

Next, the reason why a recovery loss of semiconductor apparatus 1d decreases during a recovery process of semiconductor apparatus 1d is explained. The recovery process of semiconductor apparatus 1d is a process of transition from the first state in which a higher voltage is applied to first electrode 18 than to second electrode 26 to the second state in which a higher voltage is applied to second electrode 26 than to first electrode 18.

Due to a built-in potential at the first pn junction formed between second p collector portion 22b and n type region 44, the npn transistor formed of n type region 44, second p collector portion 22b and n buffer layer 20 can interrupt the flow of carriers (electrons, holes) even in the first state in which a higher voltage is applied to first electrode 18 than to second electrode 26. In the first state, the amount of holes flowing from p anode layer 11a, p base region 11 and p well region 19 into peripheral region 103 is small. The amount of holes to be discharged from peripheral region 103 during the recovery process of semiconductor apparatus 1d is small. The recovery loss of semiconductor apparatus 1d is thus small.

In semiconductor apparatus 1d in a first modification of the present embodiment, p well region 19 may be omitted. In a second modification of the present embodiment, n buffer layer 20 may be omitted in peripheral region 103. In the second modification, p collector layer 22 is between n⁻ drift region 10 and n type region 44. P collector layer 22 is in contact with n⁻ drift region 10 and n type region 44. A first pn junction is formed between p collector layer 22 and n type region 44. A second pn junction is formed between p collector layer 22 and n buffer layer 20. In the second modification of the present embodiment, n type region 44, second p collector portion 22b and n⁻ drift region 10 function as an npn transistor.

The effect of semiconductor apparatus 1d of the present embodiment is described.

Semiconductor apparatus 1d of the present embodiment includes semiconductor substrate 7 having front surface 7a and back surface 7b, first electrode 18 provided on front surface 7a, and second electrode 26 provided on back surface 7b.

Semiconductor substrate 7 includes device region 100 including the first semiconductor device, and peripheral region 103 surrounding device region 100. The first semiconductor device includes n⁻ drift region 10, p base region 11, n⁺ emitter region 12, gate insulating film 15, gate electrode 16, n buffer layer 20, and p collector layer 22. N⁺ emitter region 12 is in contact with first electrode 18. Gate insulating film 15 is provided on the portion of p base region 11 between n⁺ emitter region 12 and n⁺ drift region 10. Gate electrode 16 faces the portion of p base region 11 with gate insulating film 15 interposed therebetween. N buffer layer 20 is in contact with n⁻ drift region 10, and is provided on the back surface 7b side with respect to n⁻ drift region 10. P collector layer 22 is in contact with n buffer layer 20, and is provided on the back surface 7b side with respect to n buffer layer 20.

N⁻ drift region 10, n buffer layer 20, p collector layer 22 and second electrode 26 extend from device region 100 to peripheral region 103. Peripheral region 103 is provided with n type region 44. N type region 44 is in contact with second electrode 26. P collector layer 22 includes the p collector portion (second p collector portion 22b) between n buffer layer 20 and n type region 44.

During an ON state of the first semiconductor device, a reverse bias voltage is applied to the first pn junction formed between second p collector portion 22b and n type region 44. The npn transistor formed of n type region 44, second p collector portion 22b and n buffer layer 20 interrupts the flow of carriers (electrons, holes). The amount of holes flowing into peripheral region 103 during an ON state of the first semiconductor device decreases significantly. The amount of holes to be discharged from peripheral region 103 during the turn-off process of the first semiconductor device decreases. Semiconductor apparatus 1d can thus reduce the turn-off loss.

Due to the built-in potential at the first pn junction formed between second p collector portion 22b and n type region 44, the npn transistor formed of n type region 44, second p collector portion 22b and n buffer layer 20 can interrupt the flow of carriers (electrons, holes) even in the first state in which a higher voltage is applied to first electrode 18 than to second electrode 26. The amount of holes flowing into peripheral region 103 in the first state is small. The amount of holes to be discharged from peripheral region 103 during the recovery process of semiconductor apparatus 1d is small. The recovery loss of semiconductor apparatus 1d is thus small.

In semiconductor apparatus 1d of the present embodiment, n type region 44 extends at least from peripheral end 60 of device region 100 to first portion 64 of peripheral region 103. First portion 64 is spaced apart from peripheral end 60 by thickness t of semiconductor substrate 7. Thickness t of semiconductor substrate 7 is defined as the distance between front surface 7a and back surface 7b at peripheral end 60 of device region 100.

Holes tend to flow into peripheral region 103 toward peripheral end 60 of device region 100, and therefore tend to flow into the portion of n type region 40 extending over the distance of thickness t of semiconductor substrate 7 from peripheral end 60 of device region 100. However, the npn transistor formed of n type region 44, second p collector portion 22b and n buffer layer 20 interrupts the flow of carriers (electrons, holes) at least over the distance equal to or greater than thickness t of semiconductor substrate 7 from peripheral end 60 of device region 100. The amount of holes to be discharged from peripheral region 103 during the turn-off process of the first semiconductor device decreases. Semiconductor apparatus 1d can reduce the turn-off loss. The amount of holes to be discharged from peripheral region 103 during the recovery process of semiconductor apparatus 1d is small. The recovery loss of semiconductor apparatus 1d is small.

In semiconductor apparatus 1d of the present embodiment, device region 100 further includes the second semiconductor device. The second semiconductor device includes p anode layer 11a provided on the front surface 7a side with respect to n⁻ drift region 10, and n⁺ cathode layer 24 provided on the back surface 7b side with respect to n drift region 10. During application of a reverse bias voltage to semiconductor apparatus 1d, the second semiconductor device prevents a current flow into the first semiconductor device. The second semiconductor device thus electrically protects the first semiconductor device to prevent breakdown of the first semiconductor device.

Due to the built-in potential at the first pn junction formed between second p collector portion 22b and n type region 44, the npn transistor formed of n type region 44, second p collector portion 22b and n buffer layer 20 can interrupt the flow of carriers (electrons, holes) in the first state in which a higher voltage is applied to first electrode 18 than to second electrode 26. The amount of holes flowing into peripheral region 103 in the first state (ON state of the second semiconductor device) is small. The amount of holes to be discharged from peripheral region 103 during the recovery process of the second semiconductor device is small. The recovery loss of semiconductor apparatus 1d is thus small.

In semiconductor apparatus 1d of the present embodiment, n type region 44 extends at least from peripheral end 60 of device region 100 to first portion 64 of peripheral region 103. Holes tend to flow into peripheral region 103 toward peripheral end 60 of device region 100, and therefore tend to flow into the portion of n type region 40 extending over the distance of thickness t of semiconductor substrate 7 from peripheral end 60 of device region 100. However, the npn transistor formed of n type region 44, second p collector portion 22b and n buffer layer 20 can interrupt the flow of carriers (electrons, holes) at least over the distance equal to or greater than thickness t of semiconductor substrate 7. The amount of holes flowing into peripheral region 103 in an ON state of the second semiconductor device (first state) is small. The amount of holes to be discharged from peripheral region 103 during the recovery process of the second semiconductor device is small. The recovery loss of semiconductor apparatus 1d is small.

Fifth Embodiment

Figure 27:
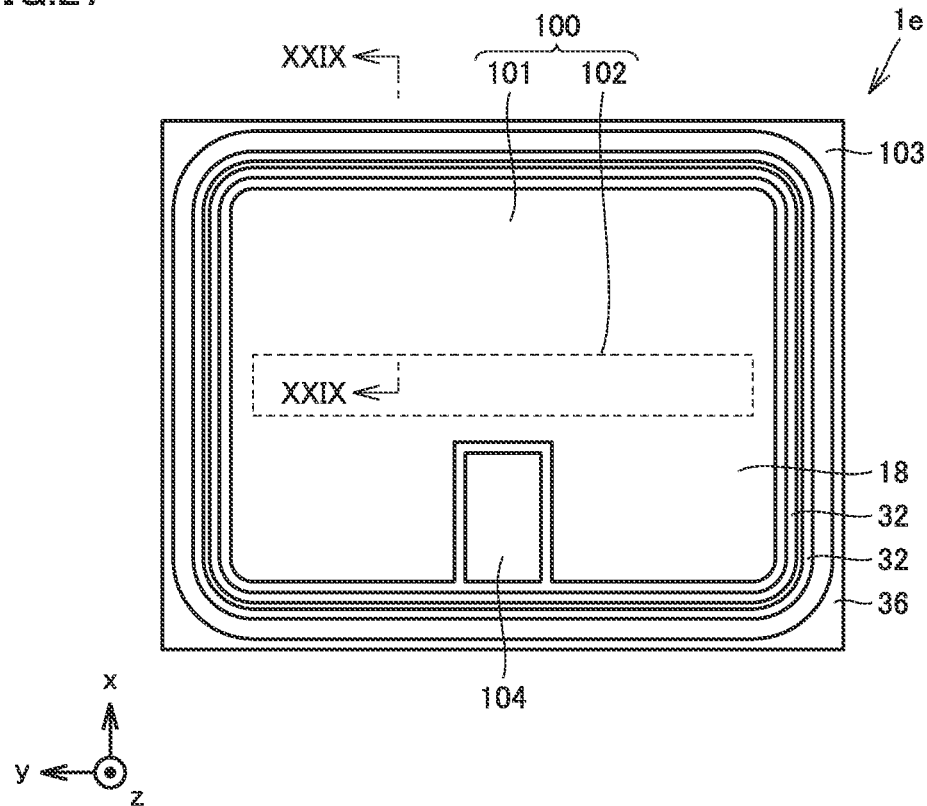
FIG. 27 is a schematic plan view of a semiconductor apparatus according to a fifth embodiment.
Figure 28:
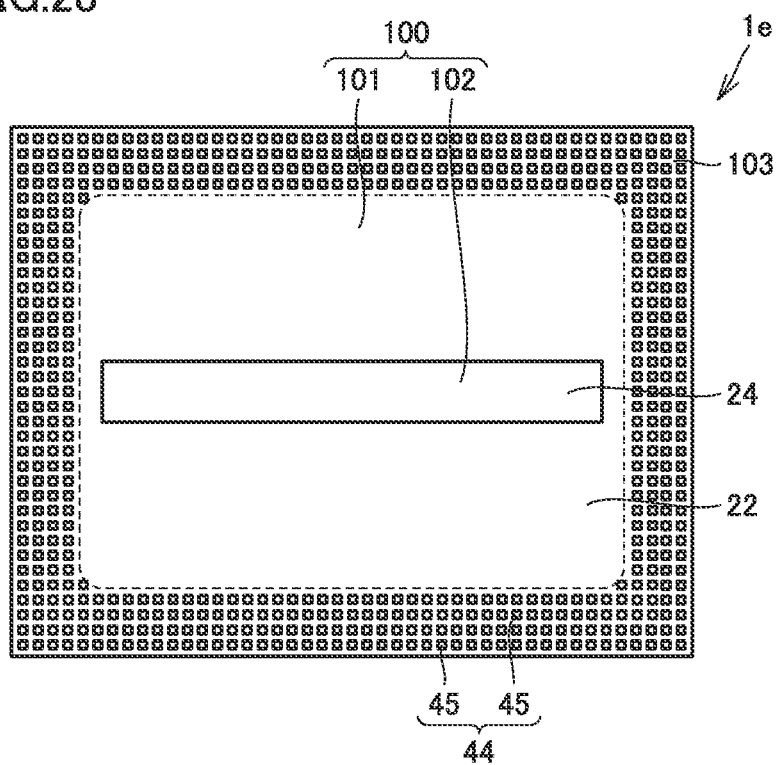
FIG. 28 is a schematic bottom view of the semiconductor apparatus according to the fifth embodiment.
Figure 29:
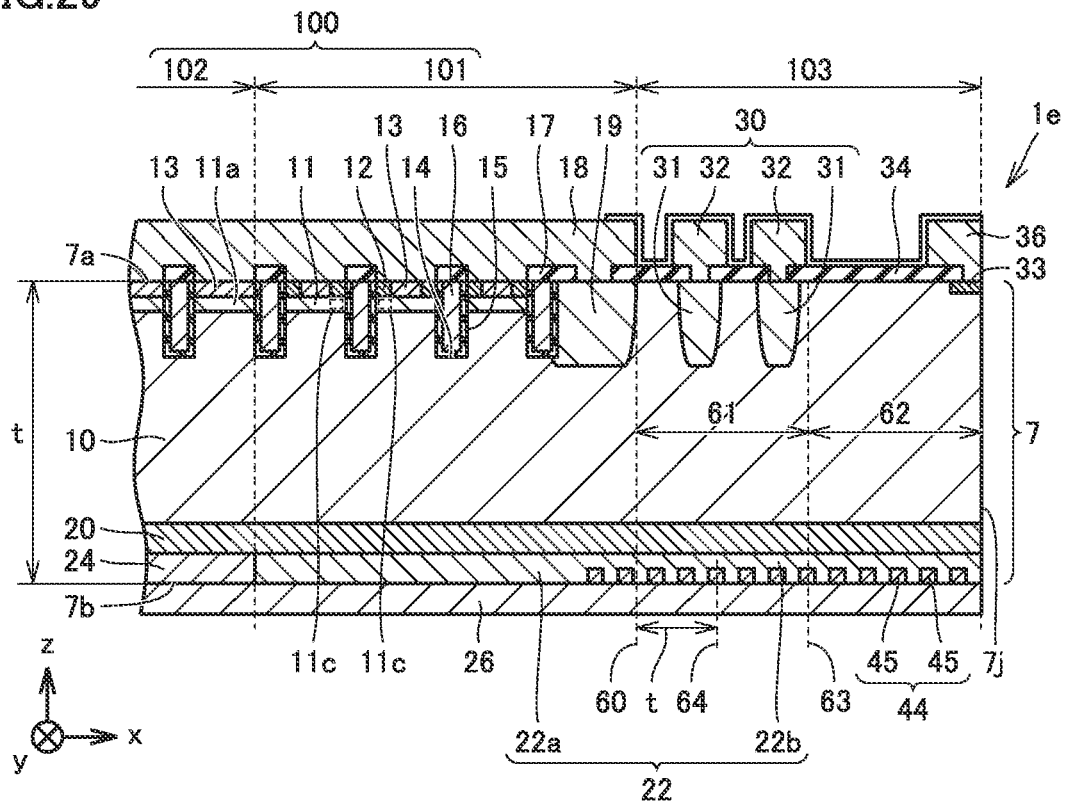
FIG. 29 is a schematic partially-enlarged sectional view of the semiconductor apparatus according to the fifth embodiment, which is taken along a section line XXIX-XXIX shown in FIG. 27.

Referring to FIGS. 27 to 29, a semiconductor apparatus 1e according to a fifth embodiment is described. Semiconductor apparatus 1e of the present embodiment has a similar configuration to semiconductor apparatus 1d of the fourth embodiment, but is different mainly on the following points.

In semiconductor apparatus 1e of the present embodiment, n type region 44 includes a plurality of n type region portions 45 in the plan view of back surface 7b. The plurality of n type region portions 45 are arranged discretely in peripheral region 103. The plurality of n type region portions 45 may be arranged two-dimensionally in peripheral region 103. Semiconductor apparatus 1e of the present embodiment can further reduce the turn-off loss and the recovery loss, for the same reason as that of the fourth embodiment, than the semiconductor apparatus of the comparative example not including n type region 44.

Sixth Embodiment

Figure 30:
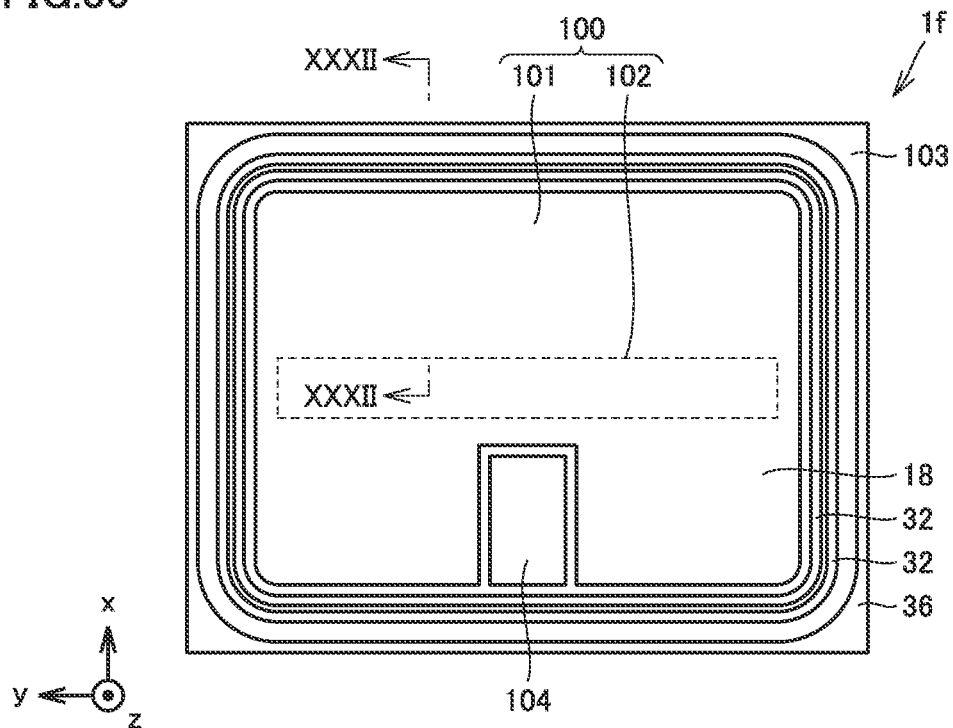
FIG. 30 is a schematic plan view of the semiconductor apparatus according to the sixth embodiment.
Figure 31:
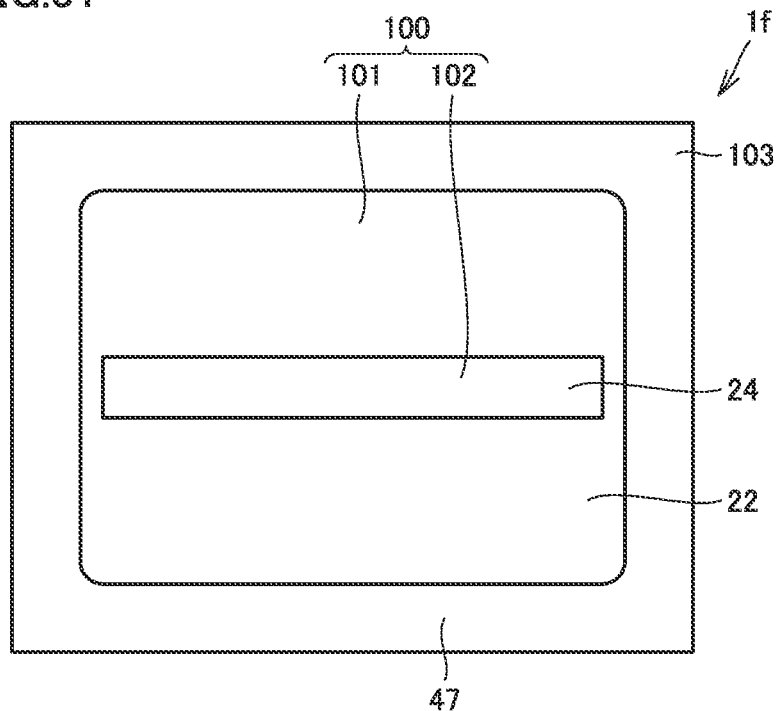
FIG. 31 is a schematic bottom view of the semiconductor apparatus according to the sixth embodiment.
Figure 32:
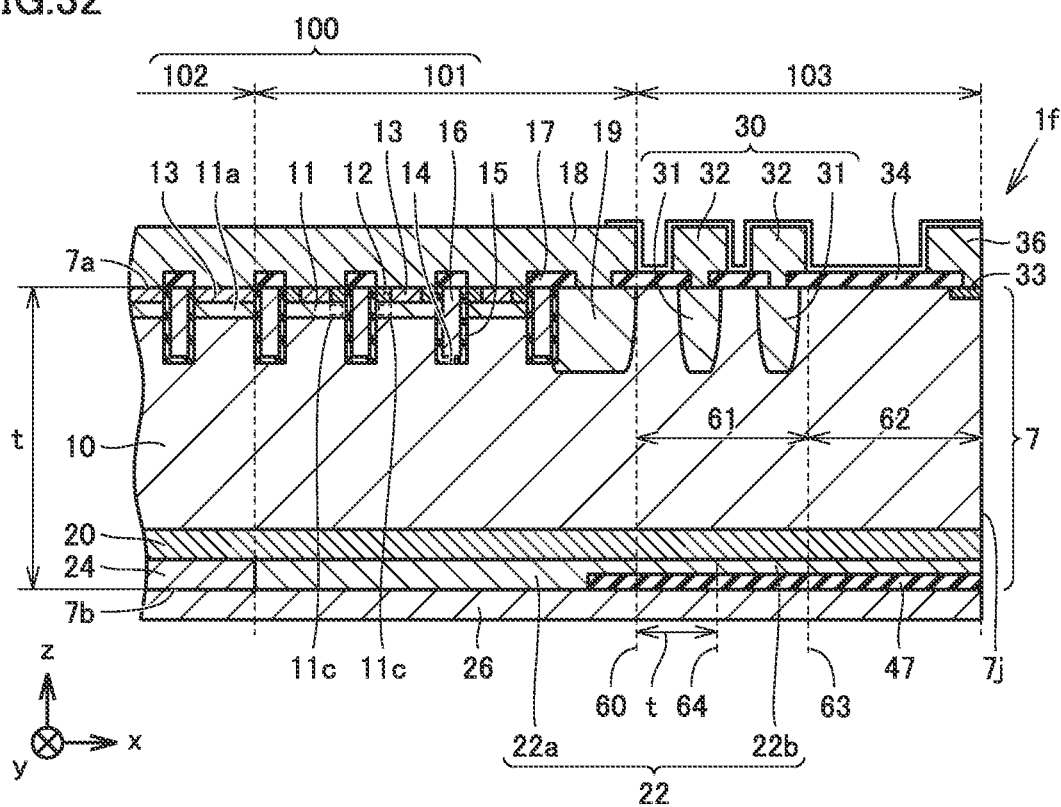
FIG. 32 is a schematic partially-enlarged sectional view of the semiconductor apparatus according to the sixth embodiment, which is taken along a section line XXXII-XXXII shown in FIG. 30.

Referring to FIGS. 30 to 32, a semiconductor apparatus 1f according to a sixth embodiment is described. Semiconductor apparatus 1f of the present embodiment has a similar configuration to semiconductor apparatus 1d of the fourth embodiment, but is different mainly on the following points.

In semiconductor apparatus 1f, peripheral region 103 is provided with an insulating region 47, instead of n type region 44 in semiconductor apparatus 1d of the fourth embodiment. Insulating region 47 is made of an oxide of a semiconductor material forming semiconductor substrate 7, for example. When semiconductor substrate 7 is a silicon substrate, for example, insulating region 47 is made of silicon dioxide. Insulating region 47 is between second p collector portion 22b and second electrode 26. Insulating region 47 is in contact with second p collector portion 22b and second electrode 26.

Insulating region 47 extends at least from peripheral end 60 of device region 100 to first portion 64 of peripheral region 103. First portion 64 is spaced apart from peripheral end 60 by thickness t of semiconductor substrate 7. Thickness t of semiconductor substrate 7 is defined as the distance between front surface 7a and back surface 7b at peripheral end 60 of device region 100. Insulating region 47 may extend from peripheral end 60 of device region 100 to intermediate portion 63 of peripheral region 103. Insulating region 47 may extend from peripheral end 60 of device region 100 to peripheral end 7j of semiconductor substrate 7. Insulating region 47 may further extend from peripheral end 60 of device region 100 to a portion of device region 100.

Referring to FIGS. 4 to 6, 19 to 22, 33 and 34, an example of a method of manufacturing semiconductor apparatus 1f of the present embodiment is described. The method of manufacturing semiconductor apparatus 1f of the present embodiment includes similar steps to the first example of the method of manufacturing semiconductor apparatus 1d of the fourth embodiment, but is different mainly on the following points.

Figure 33:
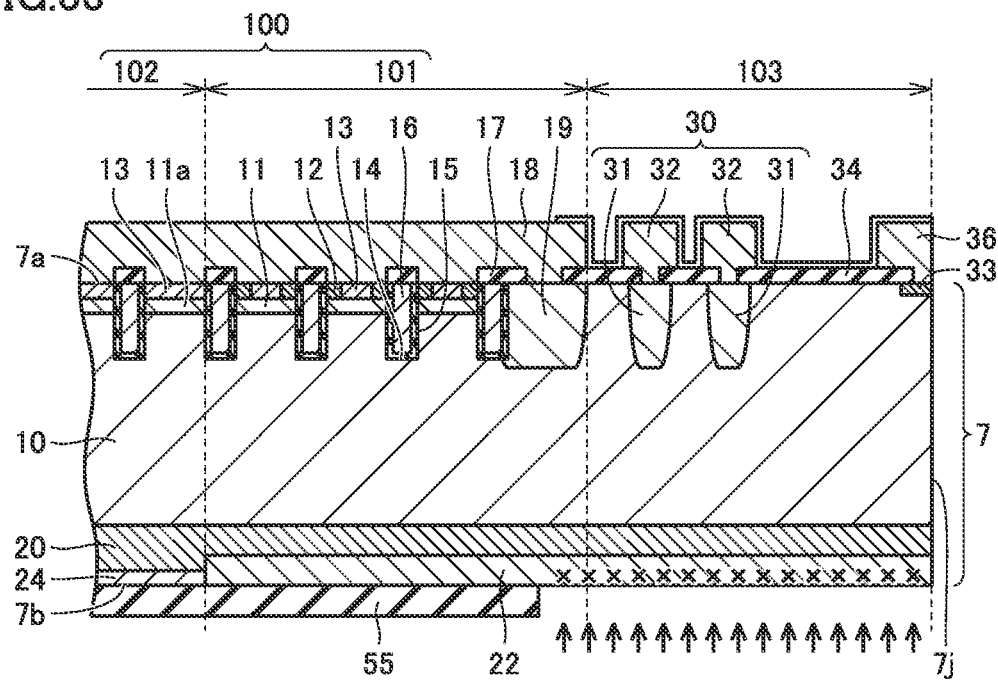
FIG. 33 is a schematic partially-enlarged sectional view showing a step subsequent to the step shown in FIG. 22 in the method of manufacturing the semiconductor apparatus according to the sixth embodiment.
Figure 34:
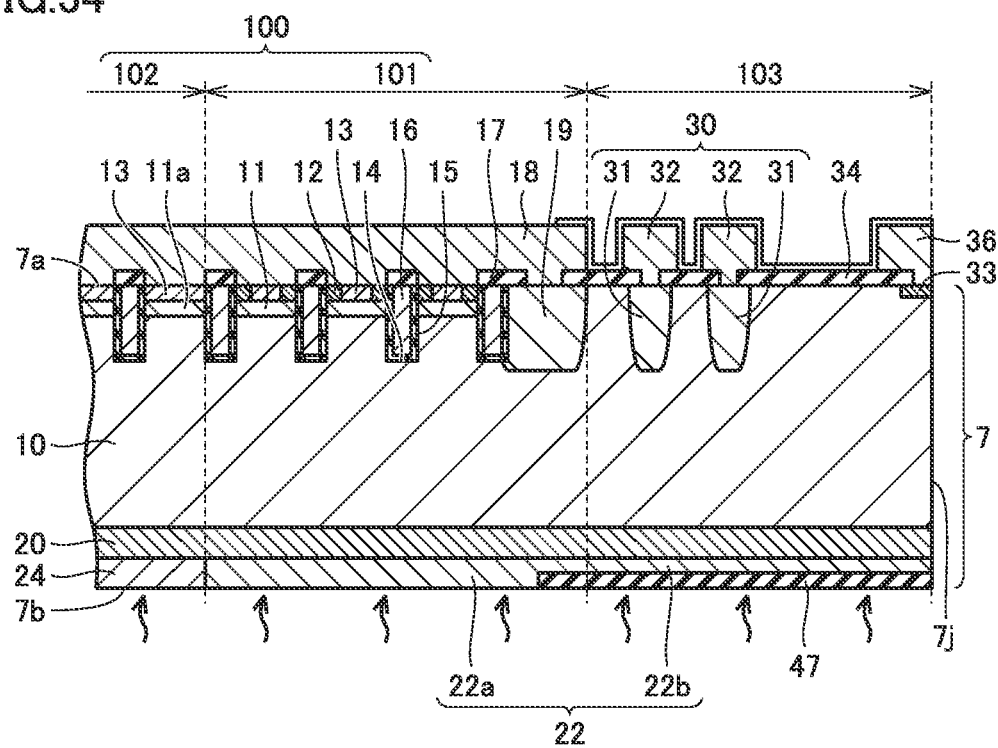
FIG. 34 is a schematic partially-enlarged sectional view showing a step subsequent to the step shown in FIG. 33 in the method of manufacturing the semiconductor apparatus according to the sixth embodiment.

After the step shown in FIG. 22, mask 55 with an opening is formed on back surface 7b as shown in FIG. 33. A portion of back surface 7b is doped with oxygen ions. The oxygen ions are doped into a portion of back surface 7b using an ion implantation device, for example. The portion of back surface 7b is a portion of back surface 7b where insulating region 47 is to be formed. Semiconductor substrate 7 doped with oxygen atoms is annealed, as shown in FIG. 34. The oxygen ions react with the semiconductor material forming semiconductor substrate 7, whereby insulating region 47 is formed on back surface 7b. Lastly, second electrode 26 is formed on p collector layer 22, $n^+$ cathode layer 24 and insulating region 47. In this manner, semiconductor apparatus 1f of the present embodiment shown in FIGS. 30 to 32 is obtained.

First, the reason why a turn-off loss of semiconductor apparatus 1f decreases is explained along with the description of operation of semiconductor apparatus 1f.

A voltage higher than a threshold voltage is applied to gate electrode 16, and a higher voltage is applied to second electrode 26 than to first electrode 18, to turn the first semiconductor device (IGBT) into an ON state. The second semiconductor device (FWD) is in an OFF state during this time.

Insulating region 47 interrupts the flow of carriers (electrons, holes). Insulating region 47 significantly reduces the amount of holes flowing into peripheral region 103 in an ON state of the first semiconductor device. The amount of holes to be discharged from peripheral region 103 during the turn-off process of the first semiconductor device decreases significantly. Semiconductor apparatus 1f can thus reduce the turn-off loss.

Next, the reason why a recovery loss of semiconductor apparatus 1f decreases during a recovery process of semiconductor apparatus 1f is explained. The recovery process of semiconductor apparatus 1f is a process of transition from the first state in which a higher voltage is applied to first electrode 18 than to second electrode 26 to the second state in which a higher voltage is applied to second electrode 26 than to first electrode 18.

Insulating region 47 interrupts the flow of carriers (electrons, holes). Insulating region 47 significantly reduces the amount of holes flowing into peripheral region 103 in the first state. The amount of holes to be discharged from peripheral region 103 during the recovery process of semiconductor apparatus 1f decreases significantly. The recovery loss of semiconductor apparatus 1f is thus small.

In semiconductor apparatus 1f in a first modification of the present embodiment, p well region 19 may be omitted. In a second modification of the present embodiment, n buffer layer 20 may be omitted in peripheral region 103. In the second modification, p collector layer 22 is between $n^-$ drift region 10 and insulating region 47. P collector layer 22 is in contact with $n^-$ drift region 10 and insulating region 47. In a third modification of the present embodiment, p collector layer 22 may be omitted in peripheral region 103. In the third modification, insulating region 47 is in contact with n buffer layer 20 and second electrode 26. In a fourth modification of the present embodiment, n buffer layer 20 and p collector layer 22 may be omitted in peripheral region 103. In the fourth modification, insulating region 47 is in contact with n⁻ drift region 10 and second electrode 26.

The effect of semiconductor apparatus 1f of the present embodiment is described.

Semiconductor apparatus 1f of the present embodiment includes semiconductor substrate 7 having front surface 7a and back surface 7b, first electrode 18 provided on front surface 7a, and second electrode 26 provided on back surface 7b. Semiconductor substrate 7 includes device region 100 including the first semiconductor device, and peripheral region 103 surrounding device region 100. The first semiconductor device includes n⁻ drift region 10, p base region 11, n⁺ emitter region 12, gate insulating film 15, gate electrode 16, and p collector layer 22. N⁺ emitter region 12 is in contact with first electrode 18. Gate insulating film 15 is provided on the portion of p base region 11 between n⁺ emitter region 12 and n⁻ drift region 10. Gate electrode 16 faces the portion of p base region 11 with gate insulating film 15 interposed therebetween. P collector layer 22 is provided on the back surface 7b side with respect to n⁻ drift region 10, and is in contact with second electrode 26.

N⁻ drift region 10 and second electrode 26 extend from device region 100 to peripheral region 103. Peripheral region 103 is provided with insulating region 47, and insulating region 47 is between n⁻ drift region 10 and second electrode 26, and is in contact with second electrode 26.

Insulating region 47 interrupts the flow of carriers (electrons, holes). Insulating region 47 significantly reduces the amount of holes flowing into peripheral region 103 in an ON state of the first semiconductor device. The amount of holes to be discharged from peripheral region 103 during the turn-off process of the first semiconductor device decreases significantly. Semiconductor apparatus 1f can thus reduce the turn-off loss.

Insulating region 47 interrupts the flow of carriers (electrons, holes).

Insulating region 47 significantly reduces the amount of holes flowing into peripheral region 103 in the first state in which a higher voltage is applied to first electrode 18 than to second electrode 26. The amount of holes to be discharged from peripheral region 103 during the recovery process of semiconductor apparatus 1f decreases significantly. The recovery loss of semiconductor apparatus 1f is thus small.

In semiconductor apparatus 1f of the present embodiment, insulating region 47 extends at least from peripheral end 60 of device region 100 to first portion 64 of peripheral region 103. First portion 64 is spaced apart from peripheral end 60 by thickness t of semiconductor substrate 7. Thickness t of semiconductor substrate 7 is defined as the distance between front surface 7a and back surface 7b at peripheral end 60 of device region 100.

Holes tend to flow into peripheral region 103 toward peripheral end 60 of device region 100, and therefore tend to flow into the portion of peripheral region 103 extending over the distance of thickness t of semiconductor substrate 7 from peripheral end 60 of device region 100. However, insulating region 47 interrupts the flow of carriers (electrons, holes) at least over the distance equal to or greater than thickness t of semiconductor substrate 7 from peripheral end 60 of device region 100. The amount of holes to be discharged from peripheral region 103 during the turn-off process of the first semiconductor device decreases. Semiconductor apparatus 1f can reduce the turn-off loss. The amount of holes to be discharged from peripheral region 103 during the recovery process of semiconductor apparatus 1f is small. The recovery loss of semiconductor apparatus 1f is small.

In semiconductor apparatus 1f of the present embodiment, device region 100 further includes the second semiconductor device. The second semiconductor device includes p anode layer 11a provided on the front surface 7a side with respect to n⁻ drift region 10, and n⁺ cathode layer 24 provided on the back surface 7b side with respect to n⁻ drift region 10. During application of a reverse bias voltage to semiconductor apparatus 1f, the second semiconductor device prevents a current flow into the first semiconductor device. The second semiconductor device thus electrically protects the first semiconductor device to prevent breakdown of the first semiconductor device.

Insulating region 47 significantly reduces the amount of holes flowing into peripheral region 103 in the first state (ON state of the second semiconductor device). The amount of holes to be discharged from peripheral region 103 during the recovery process of the second semiconductor device decreases. Semiconductor apparatus 1f can thus reduce the recovery loss.

In semiconductor apparatus 1f of the present embodiment, insulating region 47 extends at least from peripheral end 60 of device region 100 to first portion 64 of peripheral region 103. Holes tend to flow into peripheral region 103 toward peripheral end 60 of device region 100, and therefore tend to flow into the portion of peripheral region 103 extending at least over the distance of thickness t of semiconductor substrate 7 from peripheral end 60 of device region 100. However, insulating region 47 interrupts the flow of carriers (electrons, holes) at least over the distance equal to or greater than thickness t of semiconductor substrate 7 from peripheral end 60 of device region 100. The amount of holes to be discharged from peripheral region 103 during the recovery process of the second semiconductor device is small. The recovery loss of semiconductor apparatus 1f is small.

Seventh Embodiment

Figure 35:
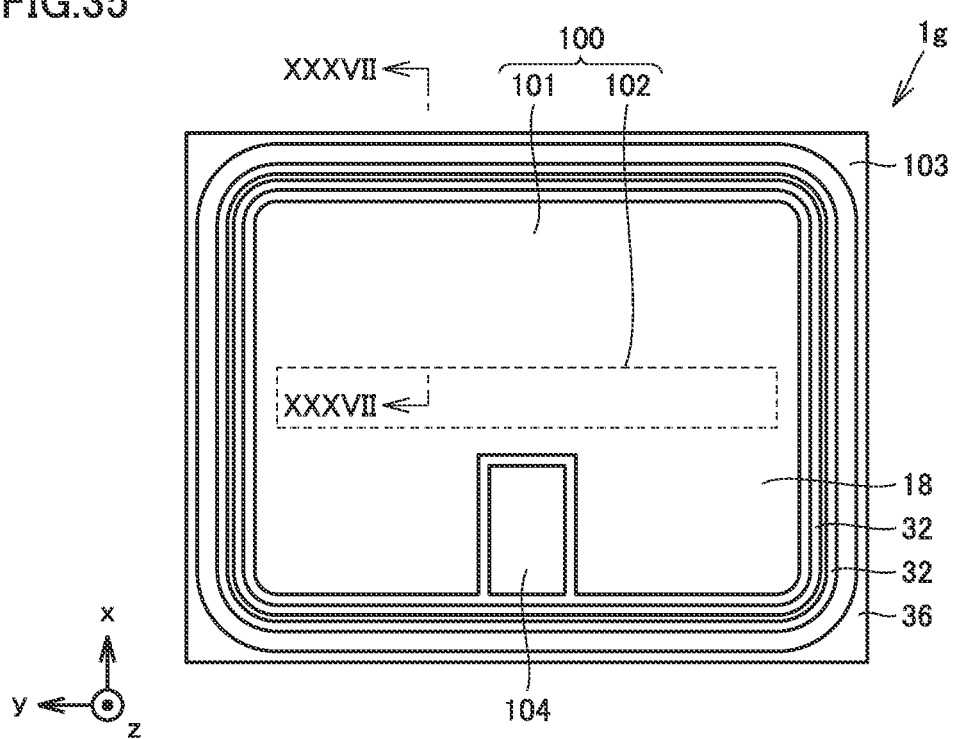
FIG. 35 is a schematic plan view of a semiconductor apparatus according to a seventh embodiment.
Figure 36:
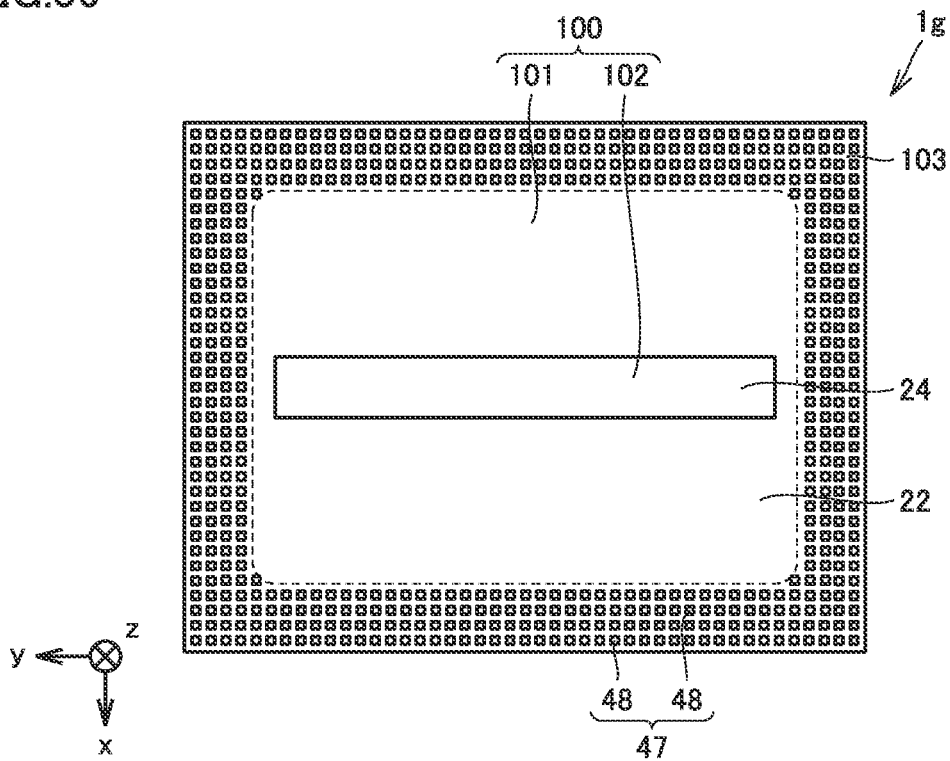
FIG. 36 is a schematic bottom view of the semiconductor apparatus according to the seventh embodiment.
Figure 37:
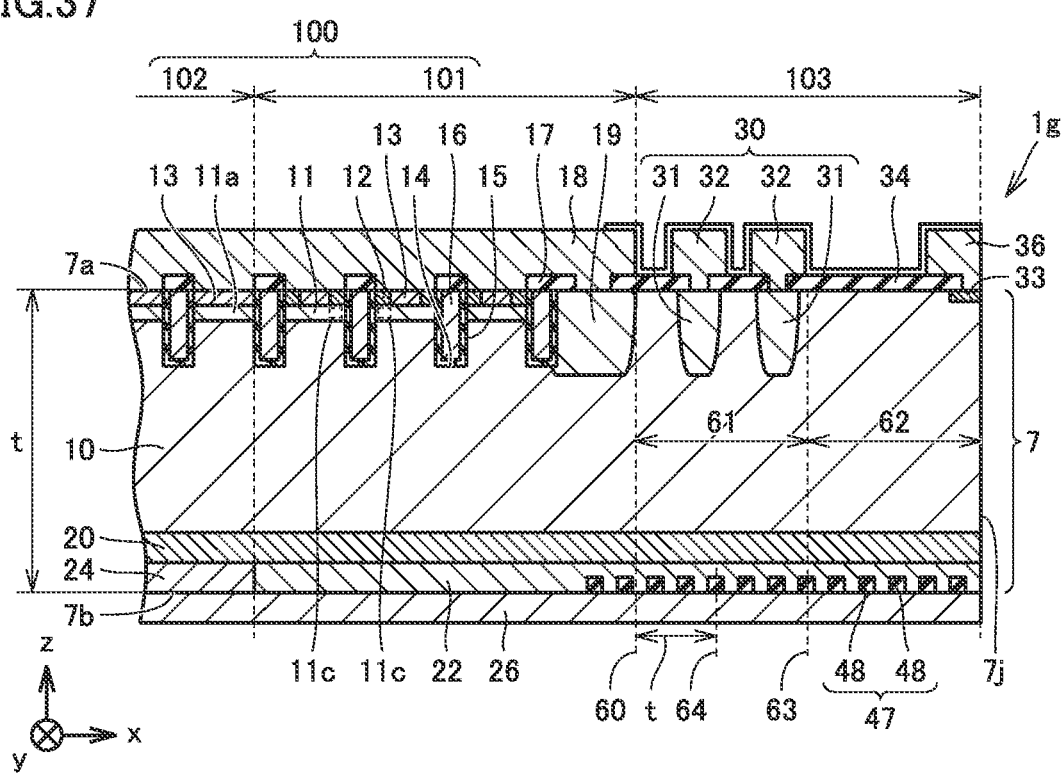
FIG. 37 is a schematic partially-enlarged sectional view of the semiconductor apparatus according to the seventh embodiment, which is taken along a section line XXXVII-XXXVII shown in FIG. 35.

Referring to FIGS. 35 to 37, a semiconductor apparatus 1g according to a seventh embodiment is described. Semiconductor apparatus 1g of the present embodiment has a similar configuration to semiconductor apparatus 1f of the sixth embodiment, but is different mainly on the following points.

In semiconductor apparatus 1g of the present embodiment, insulating region 47 includes a plurality of insulating region portions 48 in the plan view of back surface 7b. The plurality of insulating region portions 48 are arranged discretely in peripheral region 103. The plurality of insulating region portions 48 may be arranged two-dimensionally in peripheral region 103. Semiconductor apparatus 1g of the present embodiment can further reduce the turn-off loss and the recovery loss, for the same reason as that of the sixth embodiment, than the semiconductor apparatus of the comparative example not including insulating region 47.

It should be understood that the first to seventh embodiments disclosed herein are illustrative and non-restrictive in every respect. At least two of the first to seventh embodiments disclosed herein can be combined together within the range where inconsistency does not occur. The scope of the present invention is defined by the terms of the claims, rather than the description above, and is intended to include any modifications within the meaning and scope equivalent to the terms of the claims.

What is claimed is:

1. A semiconductor apparatus comprising:
a semiconductor substrate having a front surface and a back surface;
a first electrode provided on the front surface; and
a second electrode provided on the back surface,
the semiconductor substrate including a device region including a first semiconductor device, and a peripheral region surrounding the device region,
the first semiconductor device including an n⁻ drift region, a p base region, an n⁺ emitter region being in contact with the first electrode, a gate insulating film provided on a portion of the p base region between the n⁺ emitter region and the n⁻ drift region, a gate electrode facing the portion of the p base region with the gate insulating film interposed therebetween, an n buffer layer being in contact with the n⁻ drift region and provided on the back surface side with respect to the n⁻ drift region, and a p collector layer being in contact with the n buffer layer and the second electrode and provided on the back surface side with respect to the n buffer layer,
the n⁻ drift region, the n buffer layer and the second electrode extending from the device region to the peripheral region,
the p collector layer being provided also in the peripheral region,
the peripheral region being provided with an n type region, the n type region being in contact with the second electrode and the n buffer layer, and a first area ratio of the n type region in an inner portion of the peripheral region to the n type region in the peripheral region being greater than a second area ratio of the n type region in an outer portion of the peripheral region to the n type region in the peripheral region, and
the n type region is spaced apart from a peripheral end of the device region at least by a predetermined distance.

2. The semiconductor apparatus according to claim 1, wherein
the n type region has a higher electron concentration than the n buffer layer.

3. A semiconductor apparatus comprising:
a semiconductor substrate having a front surface and a back surface;
a first electrode provided on the front surface; and
a second electrode provided on the back surface,
the semiconductor substrate including a device region including a first semiconductor device, and a peripheral region surrounding the device region,
the first semiconductor device including an n⁻ drift region, a p base region, an n⁺ emitter region being in contact with the first electrode, a gate insulating film provided on a portion of the p base region between the n⁺ emitter region and the n⁻ drift region, a gate electrode facing the portion of the p base region with the gate insulating film interposed therebetween, an n buffer layer being in contact with the n⁻ drift region and provided on the back surface side with respect to the n⁻ drift region, and a p collector layer being in contact with the n buffer layer and the second electrode and provided on the back surface side with respect to the n buffer layer,
the n⁻ drift region, the n buffer layer and the second electrode extending from the device region to the peripheral region,
the p collector layer being provided also in the peripheral region,
the peripheral region being provided with an n type region, the n type region being in contact with the second electrode and the n buffer layer, and a first area ratio of the n type region in an inner portion of the peripheral region to the n type region in the peripheral region being greater than a second area ratio of the n type region in an outer portion of the peripheral region to the n type region in the peripheral region, and
the n type region is spaced apart from a peripheral end of the device region at least by a distance equal to or greater than a thickness of the semiconductor substrate, and the thickness of the semiconductor substrate is defined as a distance between the front surface and the back surface at the peripheral end.

4. The semiconductor apparatus according to claim 1, wherein
in a plan view of the back surface, the n type region formed in the peripheral region is entirely surrounded by the p collector layer.

5. The semiconductor apparatus according to claim 1, wherein
in a plan view of the back surface, a third area ratio of the n type region to the peripheral region is smaller than a fourth area ratio of the p collector layer to the peripheral region.

6. The semiconductor apparatus according to claim 1, wherein
the n type region is formed as one or more rings surrounding the device region.

7. The semiconductor apparatus according to claim 1, wherein
the n type region includes a plurality of n type region portions, and
the plurality of n type region portions are arranged discretely in the peripheral region.

8. The semiconductor apparatus according to claim 1, wherein
the device region further includes a second semiconductor device, and
the second semiconductor device includes a p anode layer provided on the front surface side with respect to the n⁻ drift region, and an n+ cathode layer provided on the back surface side with respect to the n⁻ drift region.

* * * * *